United States Patent
Park et al.

(10) Patent No.: US 11,164,631 B2
(45) Date of Patent: *Nov. 2, 2021

(54) NONVOLATILE MEMORY DEVICE AND OPERATING METHOD OF THE SAME

(71) Applicant: Samsung Electronics Co., Ltd., Suwon-si (KR)

(72) Inventors: Jong-chul Park, Hwaseong-si (KR); Youn-yeol Lee, Seoul (KR); Seul-bee Lee, Hwaseong-si (KR); Kyung-sub Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/113,939

(22) Filed: Dec. 7, 2020

(65) Prior Publication Data

US 2021/0118509 A1 Apr. 22, 2021

Related U.S. Application Data

(63) Continuation of application No. 16/458,222, filed on Jul. 1, 2019, now Pat. No. 10,885,983.

(30) Foreign Application Priority Data

Oct. 18, 2018 (KR) .................. 10-2018-0124579

(51) Int. Cl.
*G11C 16/04* (2006.01)
*G11C 11/56* (2006.01)
(Continued)

(52) U.S. Cl.
CPC ...... *G11C 16/0483* (2013.01); *G11C 11/5671* (2013.01); *G11C 16/08* (2013.01);
(Continued)

(58) Field of Classification Search
CPC ..... G11C 16/0483; G11C 16/08; G11C 16/10; G11C 16/12; G11C 16/16; G11C 11/5671; H01L 27/11582
(Continued)

(56) References Cited

U.S. PATENT DOCUMENTS 8,427,878 B2 4/2013 Shim et al.
8,570,808 B2 10/2013 Park et al.
(Continued)

FOREIGN PATENT DOCUMENTS

KR 10-1117589 B1 2/2012
KR 10-2014-0009189 A 1/2014
(Continued)

*Primary Examiner* — Son L Mai
(74) *Attorney, Agent, or Firm* — Muir Patent Law, PLLC

(57) ABSTRACT

A nonvolatile memory device includes a first memory stack including first memory cells vertically stacked on each other, a second memory stack including memory cells vertically stacked on each other, and a control logic configured to set a voltage level of a second voltage applied for a second memory operation to one of the second memory cells in the second memory stack based on a first voltage applied to one of the first memory cells in the first memory stack in a first memory operation. The second memory stack is vertically stacked on the first memory stack. Cell characteristics of the one of the first memory cells is determined using the first voltage.

10 Claims, 16 Drawing Sheets

(51) Int. Cl.
H01L 27/11582 (2017.01)
G11C 16/26 (2006.01)
G11C 16/12 (2006.01)
G11C 16/08 (2006.01)
G11C 16/10 (2006.01)

(52) U.S. Cl.
CPC .............. G11C 16/10 (2013.01); G11C 16/12 (2013.01); G11C 16/26 (2013.01); H01L 27/11582 (2013.01)

(58) Field of Classification Search
USPC .......................... 365/185.03, 185.18, 185.28
See application file for complete search history.

(56) References Cited

U.S. PATENT DOCUMENTS

| | | | |
|---|---|---|---|
| 8,730,738 B2 | 5/2014 | Oh et al. | |
| 9,064,584 B2 | 6/2015 | Jung et al. | |
| 9,305,654 B2 | 4/2016 | Parat et al. | |
| 9,330,770 B2 | 5/2016 | Shim et al. | |
| 9,343,369 B2 | 5/2016 | Du et al. | |
| 9,378,831 B2 | 6/2016 | Han et al. | |
| 9,397,110 B2 | 7/2016 | Lue | |
| 9,570,176 B2 | 2/2017 | Jung et al. | |
| 9,972,399 B2 | 5/2018 | Seo et al. | |
| 10,026,747 B2 | 7/2018 | Hwang et al. | |
| 10,056,148 B2 | 8/2018 | Kwak et al. | |
| 10,734,371 B2 | 8/2020 | Park | |
| 10,885,983 B2 * | 1/2021 | Park | G11C 11/5642 |
| 2013/0341701 A1 | 12/2013 | Blomme et al. | |
| 2015/0103592 A1 | 4/2015 | Miwa | |
| 2016/0293266 A1 | 10/2016 | Chen et al. | |

FOREIGN PATENT DOCUMENTS

| | | |
|---|---|---|
| KR | 10-2016-0047661 A | 5/2016 |
| KR | 10-2017-0056072 A | 5/2017 |
| KR | 10-1742095 B1 | 5/2017 |

* cited by examiner

| Wordline | Appl. Vol | |
|---|---|---|
| WL1 | V1_1~V1_4 | AVT |
| WL2 | V2_1~V2_4 | |
| WL3 | V3_1~V3_4 | |
| WL4 | V4_1~V4_4 | |
| WL5 | V1_4 | |
| WL6 | V2_4 | |
| WL7 | V3_4 | |
| WL8 | V4_4 | |

NONVOLATILE MEMORY DEVICE AND OPERATING METHOD OF THE SAME

CROSS-REFERENCE TO RELATED APPLICATION

This application is a continuation of and claims priority to U.S. patent application Ser. No. 16/458,222 filed on Jul. 1, 2019, which claims the benefit of Korean Patent Application No. 10-2018-0124579, filed on Oct. 18, 2018 in the Korean Intellectual Property Office, the disclosure of which is incorporated herein in its entirety by reference.

BACKGROUND

The inventive concept relates to a nonvolatile memory device, and more particularly, to a nonvolatile memory including a plurality of memory stacks.

Semiconductor memory devices are memory devices implemented by using semiconductors such as silicon (Si), germanium (Ge), gallium arsenide (GaAs), and indium phosphide (InP). The semiconductor memory devices are classified into volatile memory devices and nonvolatile memory devices.

Nonvolatile memory devices are memory devices of which data stored therein do not disappear even when power supply is interrupted. Nonvolatile memory devices may include read-only memory (ROM), programmable ROM (PROM), erasable PROM (EPROM), electrically EPROM (EEPROM), flash memory device, phase-change random access memory (RAM) (PRAM), magneto-resistive RAM (MRAM), resistive RAM (RRAM), and ferroelectric RAM (FRAM), etc. Flash memory devices may be classified into a negative-OR (NOR)-type and a negative-AND (NAND)-type.

A non-volatile memory device may have a 3D memory cell array, and a double stack structure has been developed which is generated by stacking a plurality of memory stacks generated through independent channel hole forming processes. In regard to a memory cell array of the double stack structure, an input/output method different from that of a conventional single stack structure has been used.

SUMMARY

According to an exemplary embodiment of the present inventive concept, a nonvolatile memory device includes a first memory stack comprising a plurality of first memory cells vertically stacked on each other, a second memory stack comprising a plurality of second memory cells vertically stacked on each other, and a control logic configured to set a voltage level of a second voltage applied for a second memory operation to a second memory cell of the plurality of second memory cells in the second memory stack based on a first voltage applied to a first memory cell of the plurality of first memory cells in the first memory stack in a first memory operation. The second memory stack is vertically stacked on the first memory stack. Cell characteristics of the first memory cell is determined using the first voltage.

According to an exemplary embodiment of the present inventive concept, a nonvolatile memory device includes a first memory stack including a plurality of first memory cells sequentially connected to first through $N^{th}$ word lines, a second memory stack including a plurality of second memory cells sequentially connected to $(N+1)^{th}$ through $M^{th}$ (M is an integer greater than N+1) word lines, and a control logic configured to sequentially program a first memory cell connected to one of the first through $N^{th}$ word lines in the first memory stack and a second memory cell connected to one of the $(N+1)^{th}$ through $M^{th}$ word lines. The one of the first through $N^{th}$ word lines and the one of the $(N+1)^{th}$ through $M^{th}$ word lines are positioned at substantially the same level in the first and second memory stacks respectively. According to an exemplary embodiment of the present inventive concept, a method of programming a memory device comprising a first memory stack and a second memory stack is provided as follows.

A program operation is completed on one of a plurality of first memory cells comprised in the first memory stack using a first program voltage. A second program voltage is determined based on the first program voltage. One of a plurality of second memory cells comprised in the second memory stack is programmed by applying the second program voltage to the one of the plurality of the second memory cells as a start bias voltage. The one of the plurality of first memory cells and the one of the plurality of second memory cells are positioned at substantially the same level in the first memory stack and the second memory stack respectively.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EXEMPLARY EMBODIMENTS

Figure 1:
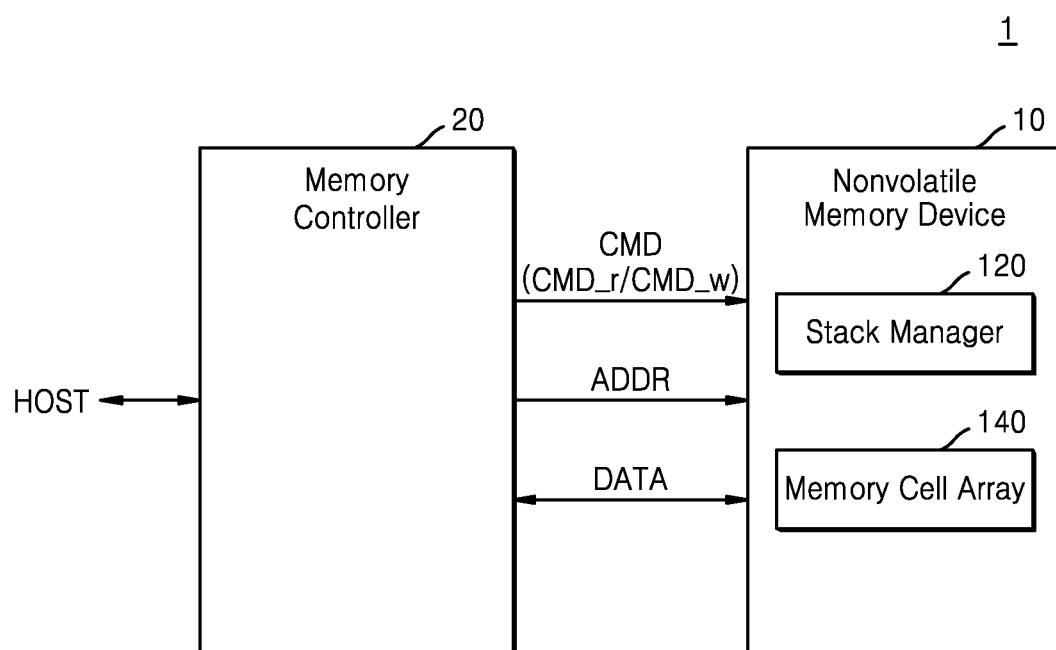
FIG. 1 is a block diagram illustrating a nonvolatile memory system according to an embodiment.

FIG. 1 is a block diagram illustrating a nonvolatile memory system 1 according to an embodiment. The values such as thickness and width of a constituent element or the shapes of the constituent element or voltages required to operate the constituent element may be expressed using "substantially the same", because the values or shapes of a semiconductor device fabricated according to the present inventive concept or voltages required to operate the semiconductor device may be different from the exact value claimed below due to a process variation for forming the semiconductor device. For example, memory stacks described below may be fabricated using the same process, but due to a process variation within a tolerable range, the memory stacks may not have exactly the same measurements, which is expressed using "substantially the same."

Referring to FIG. 1, the nonvolatile memory system 1 may include a memory controller 20 and a nonvolatile memory device 10. In an embodiment, each of a host HOST, the memory controller 20, and the nonvolatile memory device 10 may be provided in one chip, one package, one module, or the like. Alternatively, the memory controller 20 and the nonvolatile memory device 10 may be provided in a package such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), and wafer-level processed stack package (WSP).

The memory controller 20 may control the nonvolatile memory device 10 in response to a write request or a read request received from the host HOST. For example, the memory controller 20 may transmit to the nonvolatile memory device 10 a command CMD and an address ADDR in response to the write request or the read request received from the host HOST. The address ADDR that the memory controller 20 transmits to the nonvolatile memory device 10 may be a physical address in the nonvolatile memory device 10. The memory controller 20 may exchange data DATA with the nonvolatile memory device 10. In an embodiment, when the command CMD is a write command CMD w, the nonvolatile memory device 10 may write to a memory cell array 140 the data DATA received from the memory controller 20, and when the command CMD is a read command CMD r, the nonvolatile memory device 10 may output to the memory controller 20 the data DATA stored in the address ADDR received from the memory controller 20.

The nonvolatile memory device 10 may include a stack manager 120 and the memory cell array 140. The memory cell array 140 may include a plurality of memory stacks, and the stack manager 120 may control a program operation and a read operation for a plurality of memory stacks. In the inventive concept, the program operation may denote a series of operations that cause a memory cell included in a memory cell array to have a certain threshold voltage to write data to the memory cell array, and the read operation may denote an operation of determining data stored in the memory cell array.

According to an embodiment, the stack manager 120 may determine an applied voltage for another stack by using an applied voltage for one of a plurality of memory stacks. The applied voltage may include a program voltage required for the program operation and a read voltage required for the read operation.

In the program operation, the nonvolatile memory device 10 may program the memory cell by applying a plurality of program voltages to the memory cell. According to an embodiment, the stack manager 120 may apply the plurality of program voltages to any one of the plurality of memory stacks and perform a program for another stack by using any one of the plurality of program voltages, and thus, may reduce the number of voltages applied to other stacks. Accordingly, the time required for the program operation may be reduced and the performance of the program operation may be increased. This is described later in detail with reference to FIG. 8 and the like.

In the read operation, when the data DATA read from the memory cell fails in an error correction, the nonvolatile memory device 10 may change a read voltage level by applying a plurality of read voltages. According to an embodiment, the stack manager 120 may apply the plurality of read voltages to any one of the plurality of memory stacks and perform the read operation for another stack by using any one of the plurality of read voltages, and thus, may reduce the number of voltages applied to other stacks. Accordingly, the time required for the read operation may be reduced and the performance of the read operation may be increased. This is described later in detail with reference to FIG. 12 and the like.

According to an embodiment, in the program operation, the stack manager 120 may alternately perform programs, among the plurality of memory stacks, for memory cells included in the plurality of memory stacks. Accordingly, the program operation for the memory cells having substantially the same channel hole characteristics may be performed at substantially the same speed. This is described later in detail with reference to FIG. 14 and the like.

According to an embodiment, the stack manager 120 may program the memory cells in a lower portion of the plurality of memory stacks in 1 bit, the memory cells in a middle portion in 2 bits, and the memory cells in an upper portion in 3 bits. This is described later in detail with reference to FIG. 17 and the like.

The memory cell array 140 may include the plurality of memory stacks each including the plurality of memory cells. For example, the plurality of memory cells may include flash memory cells. Hereinafter, embodiments are described for the case in which the plurality of memory cells include NAND flash memory cells. However, the embodiment is not limited thereto. In other embodiments, the plurality of memory cells may include resistive memory cells such as resistive read-only memories (RAMs) (RRAMs), phase-change RAMs (PRAMs), and magneto-resistive RAMs (MRAMs).

Each of the plurality of memory stacks may constitute a three-dimensional (3D) memory array. The 3D memory array may be monolithically formed on at least one physical level of memory cell arrays which include an active region on a silicon substrate and a circuit related with operation of the memory cells on or in the silicon substrate. The term "monolithic" may mean that layers of each level constituting the memory cell array are directly stacked above the layers of each lower level of the memory cell array. Each of the plurality of memory stacks may include NAND strings arranged in a vertical direction so that at least one memory cell is arranged on another memory cell. The at least one memory cell may include a charge trapping layer. The memory cell array 140 may have a double stack structure in which the plurality of memory stacks are stacked in a manner that channel holes are connected to each other. The double stack structure is described in detail later with reference to FIGS. 4 and 5.

The following patent documents, which are hereby incorporated by reference, disclose suitable configurations for three-dimensional memory arrays, in which a three-dimensional memory array is configured as a plurality of levels, with word lines and/or bit lines shared between the levels: U.S. Pat. Nos. 7,679,133; 8,553,466; 8,654,587; and 8,559,235; and US Pat. Pub. No. 2011/0233648. In addition, U.S. Pat. Nos. 2014/0334232; and U.S. Pat. No. 8,488,381 are hereby incorporated by reference.

In this embodiment, each memory cell included in the memory cell array 140 may be a multi-level cell (MLC) storing two or more bits of data. For example, the memory cell may be an MLC storing 2-bit data. As another example, the memory cell may be a triple level cell (TLC) for storing 3-bit data or a quadruple level cell (QLC) for storing 4-bit data. However, the inventive concept is not limited thereto. In other embodiments, some memory cells included in the memory cell array 140 may be single-level cells (SLCs) storing 1-bit data, and some other memory cells may be MLCs.

Figure 2:
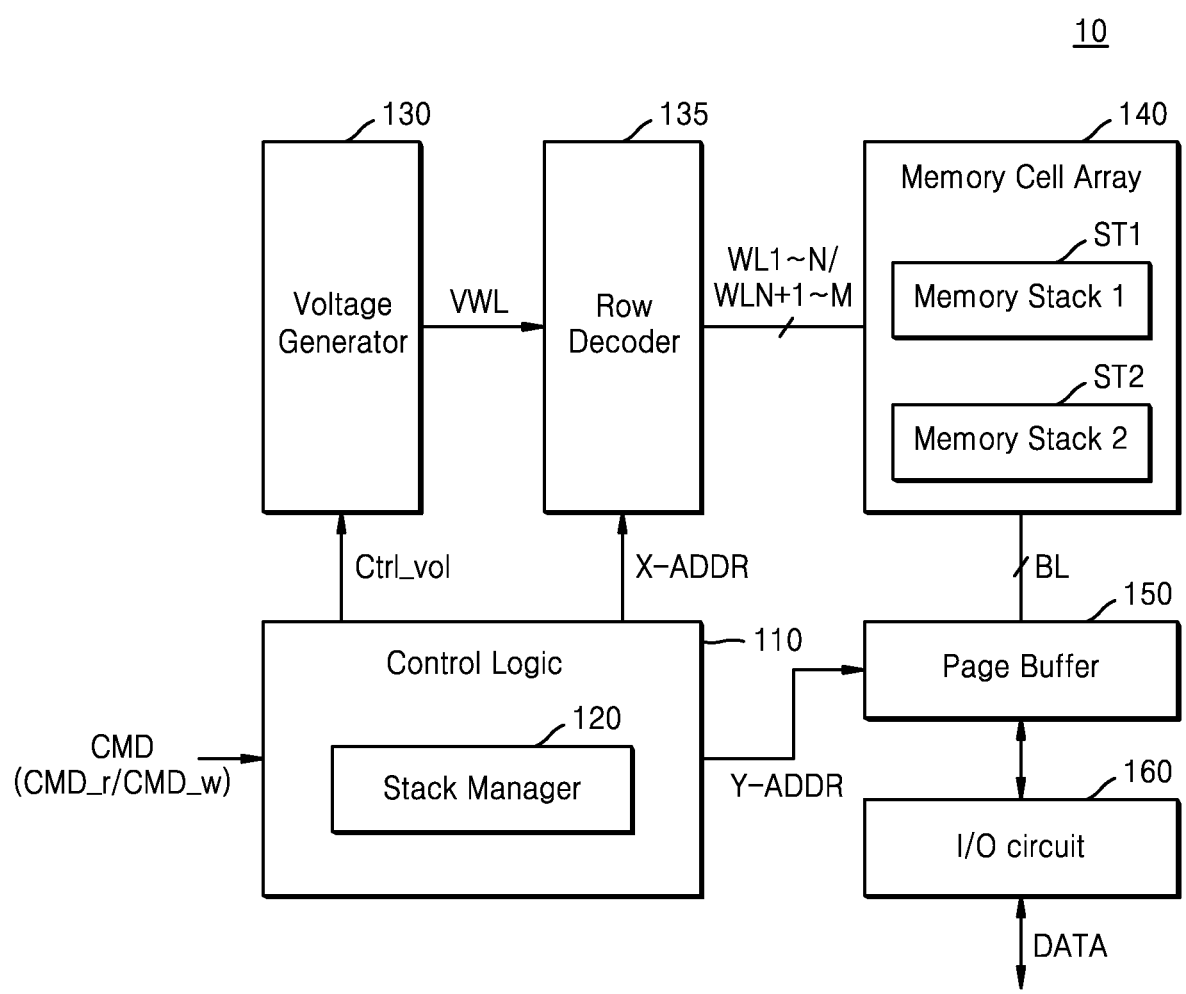
FIG. 2 is a block diagram illustrating a nonvolatile memory device according to an embodiment.

FIG. 2 is a block diagram illustrating the nonvolatile memory device 10 according to an embodiment. Descriptions already given above with reference to FIG. 1 are omitted.

Referring to FIG. 2, the nonvolatile memory device 10 may include a control logic 110, a page buffer 150, the memory cell array 140, a voltage generator 130, a row decoder 135, and an input/output (I/O) circuit 160.

The control logic 110 may include the stack manager 120. The control logic 110 may, based on the command CMD (or CMD_r/CMD_w) and the address ADDR received from the memory controller (20 in FIG. 1), output various control signals for writing the data DATA to the memory cell array 140 or reading the data DATA from the memory cell array 140.

The stack manager 120 may output various control signals (for example, a voltage control signal Ctrl_vol and a row address X-ADDR) for controlling each or all of a first memory stack ST1 and a second memory stack ST2. For convenience of explanation, that the stack manager 120 outputs to the voltage generator 130 the voltage control signal Ctrl_vol including information of the applied voltages for the plurality of first and second memory stacks ST1 and ST2 may be equivalent to that the stack manager 120 outputs various voltages to the plurality of first and second memory stacks ST1 and ST2.

In addition, for convenience of explanation, that the stack manager 120 outputs to the row decoder 135 the row address X-ADDR including address information of a word line WL connected to a selection memory cell to be programmed or read for the program operation or the read operation may be equivalent to that the stack manager 120 programs the selection memory cell included in the plurality of first and second memory stacks ST1 and ST2 or reads from the selection memory cell.

The memory cell array 140 may include the first memory stacks ST1 and the second memory stacks ST2 that are vertically stacked. The first memory stack ST1 may be connected to the row decoder 135 through first through $N^{th}$ (N is an integer of 1 or more) word lines WL1 through WLN, and the second memory stack ST2 may be connected to the row decoder 135 through $(N+1)^{th}$ through $M^{th}$ (M is an integer of N or more) word lines WLN+1 through WLM. The first memory stack ST1 and the second memory stack ST2 are described in detail later with reference to FIG. 4 and the like.

The voltage generator 130 may generate various kinds of voltages for performing the program operation, the read operation, and an erase operation for the memory cell array 140 based on the voltage control signal Ctrl_vol. The voltage generator 130 may generate word line voltages VWL, for example, a program voltage (or a write voltage), a read voltage, a pass voltage (or a word line non-selection voltage), a verify voltage, a recovery voltage, etc.

The row decoder 135 may select some word lines among the first through $M^{th}$ word lines WL1 through WLM in response to the row address X-ADDR. The row decoder 135 may transfer the word line voltages VWL to word lines. In the program operation, the row decoder 135 may apply the program voltage and the verify voltage to the selected word line and a program inhibit voltage to the unselected word line. In the read operation, the row decoder 135 may apply the read voltage to the selected word line and a read inhibit voltage to the unselected word line. In a recovery operation, the row decoder 135 may apply the recovery voltage to the selected word line. In addition, the row decoder 135 may select some string selection lines among the string selection lines or some ground selection lines among the ground selection lines in response to the row address X-ADDR.

The page buffer 150 may be connected to the memory cell array 140 via a bit line BL and may select the bit line BL based on a column address Y-ADDR received from the control logic 110. The I/O circuit 160 may receive the data DATA from the outside (for example, the memory controller 20 in FIG. 1) and store the input data DATA in the memory cell array 140, or may read the data DATA from the memory cell array 140 and output the read data DATA to the outside.

Figure 3:
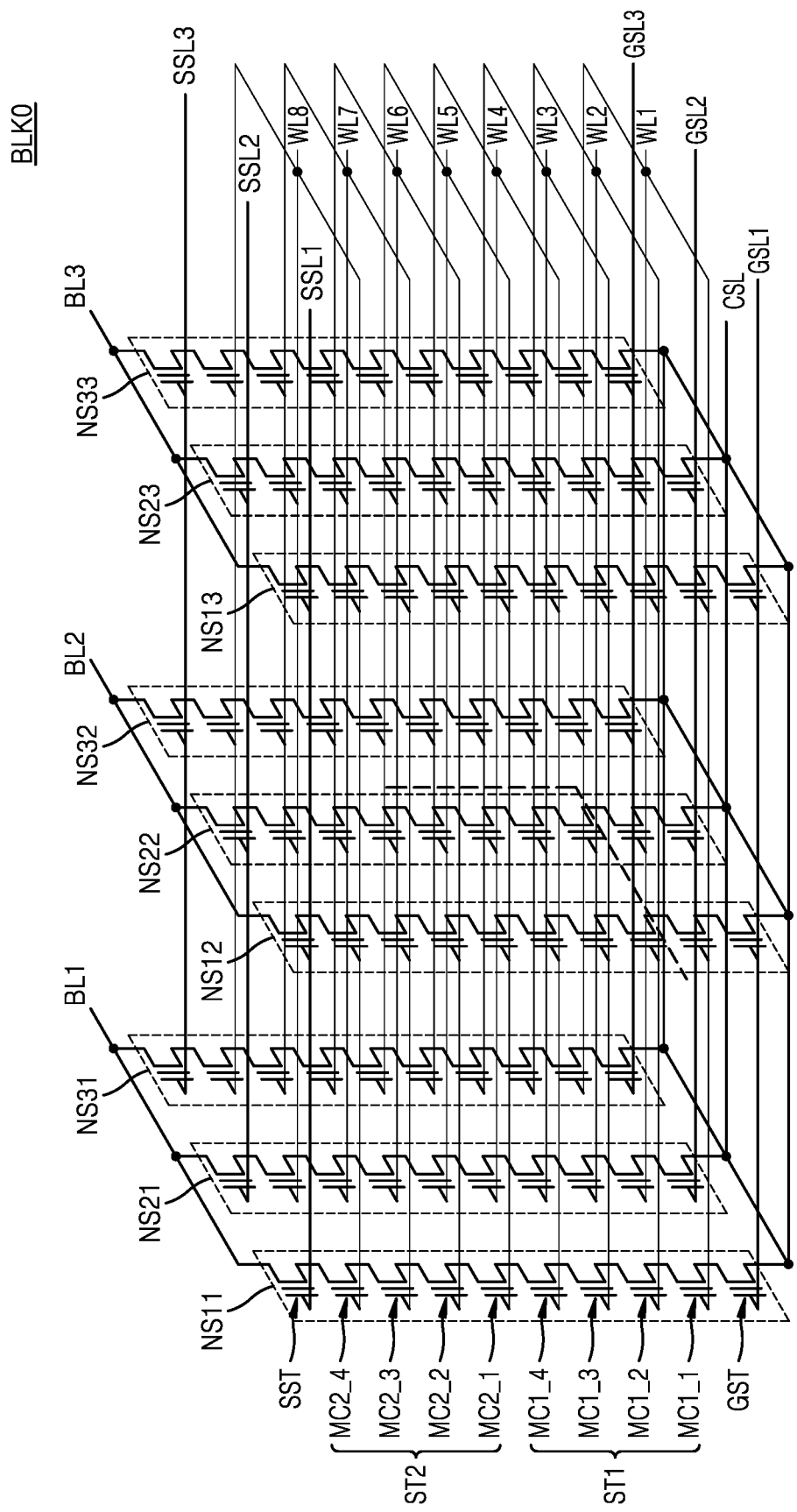
FIG. 3 is a circuit diagram illustrating a memory block included in a memory cell array according to an embodiment.

FIG. 3 is a circuit diagram illustrating a memory block BLK0 included in a memory cell array according to an embodiment.

Referring to FIG. 3, the memory cell array (for example, 140 in FIG. 2) may be a memory cell array of a vertical NAND flash memory and may include a plurality of memory blocks BLK0. Each memory block BLK0 may include a plurality of NAND strings (NS11 through NS33), a plurality of word lines (WL1 through WL8), a plurality of bit lines (BL1 through BL3), a plurality of ground selection lines (GSL1 through GSL3), a plurality of string selection lines (SSL1 through SSL3), and a common source line CSL. A plurality of first memory cells (MC1_1 through MC1_4) connected to the first through fourth word lines WL1 through WL4 may constitute the first memory stack ST1, and a plurality of second memory cells (MC2_1 through MC2_4) connected to the fifth through eighth lines WL5 through WL8 may constitute the second memory stack ST2. Here, the number of NAND cell strings, the number of word lines, the number of bit lines, the number of ground selection lines, the number of cell string selection lines, and the number of memory cells each constituting the first and second memory stacks ST1 and ST2 may be variously changed.

The NAND cell strings (NS11, NS21, and NS31) may be between the first bit line BL1 and the common source line CSL, the NAND cell strings (NS12, NS22, and NS32) may be between the second bit line BL2 and the common source line CSL, and the NAND cell strings (NS13, NS23, and NS33) may be between the third bit line BL3 and the common source line CSL. Each NAND cell string (for example, NS11) may include a cell string selection transistor SST, a plurality of memory cells (MC1 through MC8), and a ground selection transistor GST, which are connected in series.

Cell strings connected in common to one bit line may constitute one column. For example, the cell strings (NS11, NS21, and NS31) commonly connected to the first bit line BL1 may correspond to a first column, the cell strings (NS12, NS22, and NS32) commonly connected to the second bit line BL2 may correspond to a second column, and the cell strings (NS13, NS23, and NS33) commonly connected to the third bit line BL3 may correspond to a third column.

The cell strings connected to one cell string selection line may constitute one row. For example, the cell strings (NS11, NS12, and NS13) connected to the first cell string selection line SSL1 may correspond to a first row, the cell strings (NS21, NS22, and NS23) connected to the second cell string selection line SSL2 may correspond to a second row, and the cell strings (NS31, NS32, and NS33) connected to the third cell string selection line SSL3 may correspond to a third row.

The cell string selection transistor SST may be connected to the corresponding cell string selection lines (SSL1 through SSL3). The plurality of memory cells (MC1_1 through MC2_4) may be connected to the corresponding word lines (WL1 through WL8), respectively. The ground selection transistor GST may be connected to the corresponding ground selection lines (GSL1 through GSL3). The cell string selection transistor SST may be connected to the corresponding bit lines (BL1 through BL3), and the ground selection transistor GST may be connected to the common source line CSL.

Word lines on the same level (for example, WL1) may be commonly connected to each other, while the string selection lines (SSL1 through SSL3) are apart from each other and the ground selection lines (GSL1 through GSL3) are apart from each other. For example, when memory cells connected to the first word line WL1 and belonging to the cell strings (NS11, NS12, and NS13) are programmed, the first word line WL1 and the first string selection line SSL1 may be selected. The ground selection lines (GSL1 through GSL3) may be commonly connected to each other. In addition, the memory cells (for example, MC1_1 and MC2_1) connected to the word lines (for example, WL1 and WL5) on the same level of the memory stacks (ST1 and ST2) may have substantially the same properties, respectively. This is described later with reference to FIG. 4.

Figure 4:
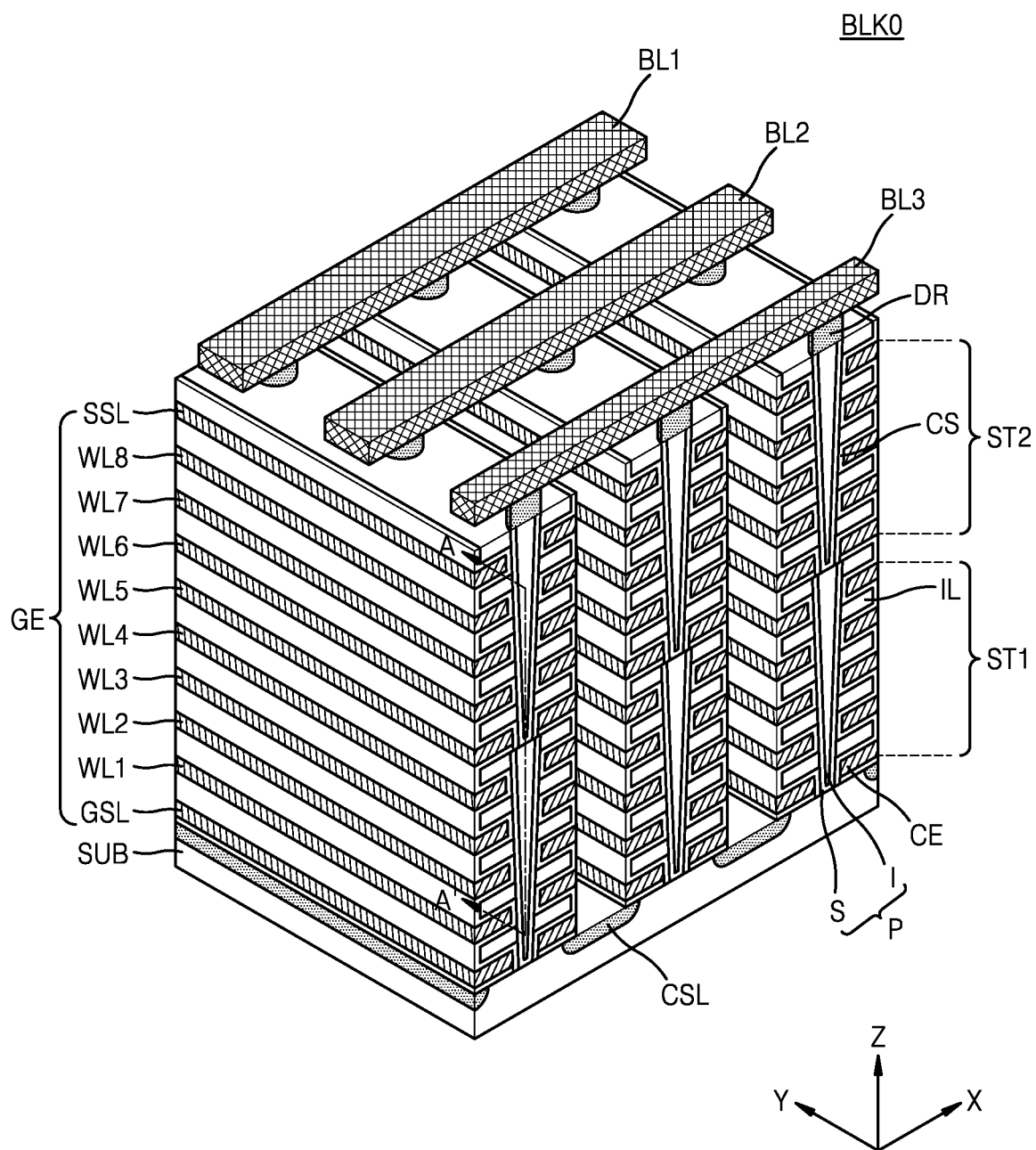
FIG. 4 is a perspective view of the memory block of FIG. 3.

FIG. 4 is a perspective view of the memory block BLK0 of FIG. 3.

Referring to FIG. 4, each memory block BLK0 included in a memory cell array (for example, 140 in FIG. 2) may be formed in a vertical direction with respect to a substrate SUB. In FIG. 4, the memory block BLK0 is illustrated as including two selection lines (GSL and SSL), eight word lines (WL1 through WL8), and three bit lines (BL1 through BL3), but the numbers thereof may actually be more or less than these numbers.

The substrate SUB may be of a first conductivity type (for example, a p-type), and the common source line CSL that extends therein in a first direction (for example, a Y-direction) and is of a second conductivity type (for example, n-type) may be provided.

The first memory stack ST1 may be provided on the substrate SUB. In a region of the substrate SUB between two adjacent common source lines CSL, a plurality of insulating layers IL, which extend in the first direction, may be sequentially provided in a third direction (for example, a Z-direction), and the plurality of insulating layers IL may be apart from each other by a certain distance in the third direction. For example, the plurality of insulating layers IL may include an insulating material such as silicon oxide. In the region of the substrate SUB between two adjacent common source lines CSL, a plurality of pillars Ps sequentially arranged in the first direction may be provided and may penetrate the plurality of insulating layers ILs in the third direction. For example, the plurality of pillars P may penetrate the plurality of insulating layers IL and contact the substrate SUB. A surface layer S of each pillar P may include a silicon material of the first type and may function as a channel region. On the other hand, an inner layer I of each pillar P may include an insulating material such as silicon oxide or an air gap.

In the region between two adjacent common source lines CSL, a charge storage layer CS may be provided along exposed surfaces of the insulating layers IL, the pillars P, and the substrate SUB. The charge storage layer CS may include a gate insulating layer (or a tunneling insulating layer), a charge trap layer, and a blocking insulating layer. For example, the charge storage layer CS may have an oxide-nitride-oxide (ONO) structure. In addition, in a region between two adjacent common source lines CSL, a gate electrode GE including the selection lines (GSL and SSL) and the word lines (WL1 through WL4) may be provided on an exposed surface of the charge storage layer CS.

The memory block BLK0 according to the technical idea of the inventive concept may additionally be provided with the second memory stack ST2 generated in the same manner on the first memory stack ST1 generated by the above method. Drains or drain contacts DR may be provided on each of the plurality of pillars P extending to the second memory stack ST2. For example, the drains or the drain contacts DR may include a silicon material doped with impurities of the second conductivity type. On the drains DR, the bit lines (BL1 through BL3) which extend in the second direction (for example, the X-axis) and are apart from each other by a certain distance in the first direction may be provided.

Figure 5:
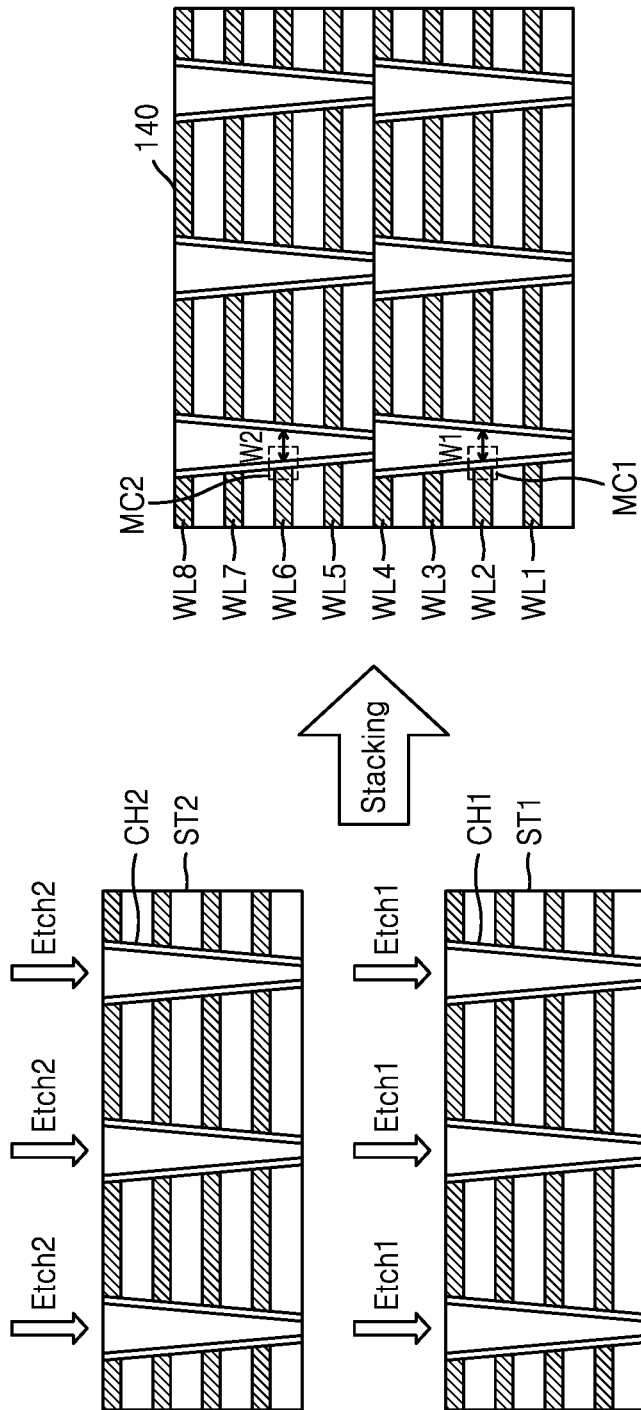
FIG. 5 is a diagram illustrating a method of generating a memory cell array, according to an embodiment.

FIG. 5 is a diagram illustrating a method of forming a memory cell array, according to an embodiment. FIG. 5 illustrates a section taken along the line A-A' in FIG. 4. Descriptions already given with reference to FIG. 4 are omitted.

Referring to FIG. 5, the first memory stack ST1 may be formed through a first etch Etch1 on a plurality of layers formed by the method described above with reference to FIG. 4. In addition, the second memory stack ST2 may be formed through a second etch Etch2 on a plurality of layers formed independently from the first memory stack ST1. The memory cell array 140 may be formed by stacking the first memory stack ST1 and the second memory stack ST2 to share channel holes with each other. In an exemplary embodiment, the first memory stack ST1 may include a first channel hole CH1 and the second memory stack ST2 may include a second channel hole CH2 connected to the first channel hole CH1. The second channel hole CH2 may have a bottom having a second width smaller than a width of a top of the first channel hole CH1. The first memory stack ST1 may include a first memory cell MC1 connected to the second word line WL2, and the second memory stack ST2 may include a second memory cell MC2 connected to the sixth word line WL6.

Since the first memory stack ST1 and the second memory stack ST2 undergo the same production process including the same etching process, widths (for example, W1 and W2) of the channel holes included in the memory cells (for example, MC1 and MC2) at the same level within the first memory stack ST1 and the second memory stack ST2 may have substantially the same profiles. For example, the first width W1 of the channel hole included in the first memory cell MC1 may be the same as or similar to the second width W2 of the channel hole included in the second memory cell MC2. Accordingly, the memory cells may have substantially the same cell characteristics such as a threshold voltage distribution, for example, and thus various operations of the first memory cell MC1 and the second memory cell MC2 may be performed using substantially the same voltages. For example, when two memory cells have substantially the same threshold voltage distribution, applied voltages for an operation such as a program operation and a read operation may be substantially the same.

A nonvolatile memory device according to the technical idea of the inventive concept may perform an operation such as a program operation and a read operation on the plurality of memory stacks (ST1 and ST2) by using substantially the same program/read characteristics of the memory cells (for example, MC1 and MC2) at the same level within the plurality of memory stacks, and thereby may increase the speed of the operation such as the program operation and the read operation. In other words, the nonvolatile memory device may determine an applied voltage to be applied to the second memory stack ST2 based on any one of a plurality of applied voltages applied for determining cell characteristics of the first memory stack ST1. For example, an operation may be performed on the first memory stack ST1 using a plurality of applied voltages until the operation is completed, and a voltage to be applied to the second memory stack ST2 may be determined based on any one of a plurality of applied voltages at which the operation performed on the first memory stack ST1 has been completed. In an embodiment, a plurality of applied voltages applied to the memory cells to determine cell characteristics may be a plurality of first program voltages for incremental step pulse programming (ISPP), and the nonvolatile memory device may apply to the second memory stack ST2 any one of the plurality of first program voltages applied to the first memory stack ST1. In an embodiment, the plurality of applied voltages applied to the memory cells to determine cell characteristics may be a plurality of first read voltages for a read retry operation, and the nonvolatile memory device may perform the read retry operation by applying to the second memory stack ST2 any one of the plurality of first read voltages applied to the first memory stack ST1.

Figures 6, 7:
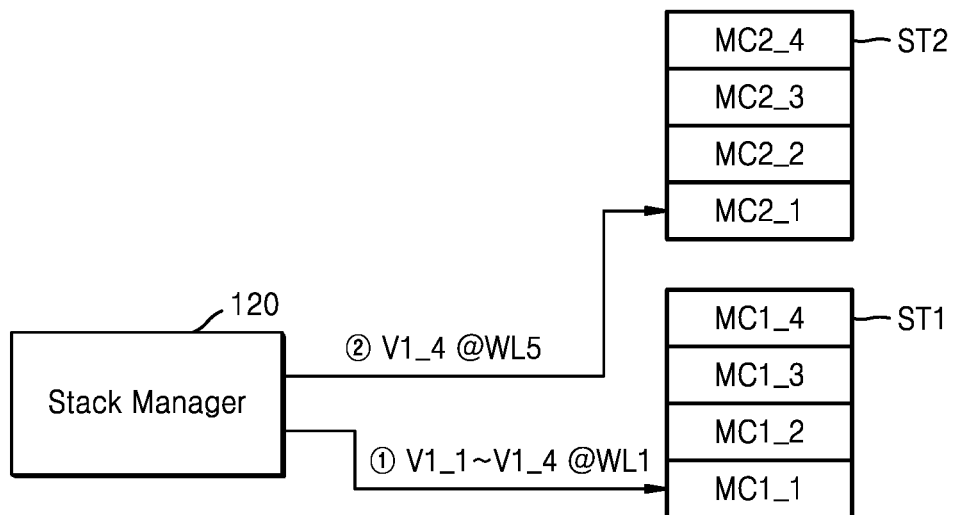
FIG. 6 is a diagram illustrating an operation of a nonvolatile memory device, according to an embodiment.
FIG. 7 is a table showing applied voltages for word lines of a stack manager according to an embodiment.

FIG. 6 is a diagram illustrating an operation of the nonvolatile memory device 10 according to an embodiment.

Referring to FIG. 6, the nonvolatile memory device 10 may include the stack manager 120, the first memory stack ST1, and the second memory stack ST2. The first memory stack ST1 may include the plurality of first memory cells (MC1_1 through MC1_4), and the second memory stack ST2 may include the plurality of second memory cells (MC2_1 through MC2_4). In addition, the plurality of first memory cells (MC1_1 through MC1_4) may be sequentially connected to the first through fourth word lines WL1 through WL4, and the plurality of second memory cells (MC2_1 through MC2_4) may be sequentially connected to the fifth through eighth word lines WL5 through WL8.

The stack manager 120 may apply a plurality of first applied voltages (V1_1 through V1_4) to the first word line WL1 for an operation such as a program operation and a read retry operation. In an embodiment, when the plurality of first applied voltages (V1_1 through V1_4) are program voltages for a programming operation, the stack manager 120 may program the first memory cell MC1_1 connected to the first word line WL1 by sequentially applying the plurality of first applied voltages (V1_1 through V1_4). For example, the program operation may be performed using an incremental step pulse programming (ISPP) scheme, where the first applied voltage V1_1 is a start bias voltage for the ISPP scheme and the first applied voltage V1_4 is an end bias voltage for the ISPP scheme. The programming operation performed on a memory cell is completed at the application of the end bias voltage. In an embodiment, when the plurality of first applied voltages (V1_1 through V1_4) are the read voltages that have been changed according to an error correction failure, the stack manager 120 may read data from the first memory cell MC1_1 connected to the first word line WL1 by sequentially applying the plurality of first applied voltages (V1_1 through V1_4). For example, when a read operation performed on the first memory cell MC1_1 of the first memory stack ST1 is unsuccessful (i.e., an error correction of read data fails), a read retry operation may be performed on the first memory cell MC1_1 to set a new read voltage by applying the plurality of first applied voltages (V1_1 through V1_4) thereto. For example, the stack manager 120 may read data from the first memory cell MC1_1 connected to the first word line WL1 by sequentially applying the plurality of first applied voltages (V1_1 through V1_4) to set the new read voltage. The first applied voltage V1_1 is a start read retry voltage and the first applied voltage V1_4 is an end read retry voltage (i.e., the new read voltage) at which the read retry operation has been completed.

The stack manager 120 may apply to the fifth word line WL5 any one voltage (for example, V1_4) of the plurality of first applied voltages (V1_1 through V1_4) applied to the first word line WL1. In an embodiment in which the plurality of first applied voltages (V1_1 through V1_4) are the program voltages, the stack manager 120 may program the second memory cell MC2_1 connected to the fifth word line WL5 by applying to the fifth word line WL5 any one voltage, (for example, V1_4) of the plurality of first applied voltages (V1_1 through V1_4) applied to the word line WL1 as a start bias voltage of the ISPP scheme for the second stack ST2. For example, the stack manager 120 may program the second memory cell MC2_1 connected to the fifth word line WL5 by applying the end program voltage V1_4 to the fifth word line WL5 as a start bias voltage of the ISPP scheme for the second memory cell MC2_1 of the second stack ST2.

In an embodiment in which the plurality of first applied voltages (V1_1 through V1_4) are a plurality of read retry voltages, when an error correction fails for the data read from the second memory cell MC2_1 connected to the fifth word line WL5, the stack manager 120 may read the data from the second memory cell MC2_1 connected to the fifth word line WL5 by applying to the fifth word line WL5 any one read retry voltage (for example, V1_4) of the plurality of first applied voltages (V1_1 through V1_4) as a read voltage for the read operation performed on the fifth word line WL5. For example, the stack manager 120 may perform a read operation on the second memory cell MC2_1 connected to the fifth word line WL5 by applying the end read retry voltage V1_4 to the fifth word line WL5 as a read voltage for the read operation performed on the second memory cell MC2_1 of the second stack ST2. Accordingly, another read retry operation for the second stack ST2 may be avoided.

The stack manager 120 according to certain aspects of the inventive concept may perform the program operation or the read retry operation for the first memory cell MC1_1 by using the plurality of first applied voltages (V1_1 through V1_4) for the first memory stack ST1, and by using any one voltage (for example, V1_4) of the plurality of first applied voltages (V1_1 through V1_4) for the program operation or the read operation of the second memory cell MC2_1 of the second memory stack ST2 at the same level as the first memory cell MC1_1, a duplicate application of applied voltages may be avoided. As a result, performance of the program operation or the read operation may be improved.

In FIG. 6, an example is illustrated in which a voltage applied to the second memory cell MC2_1 connected to the fifth word line WL5 by using applied voltage information for the first memory cell MC1_1 connected to the first word line WL1 is described. However, the method of controlling the applied voltage of the second memory cell MC2_1 connected to the fifth word line WL5 may also be applied to the remaining second memory cells (MC2_2 through MC2_4) of the second stack ST2.

In the example of FIG. 6, the plurality of first applied voltages (V1_1 through V1_4) are illustrated to include four voltages. For example, for a programming operation, the first applied voltages V1_1 through V1_4 may be sequentially applied from the first applied voltage V1_1 to the first applied voltage V1_4 in the ISPP scheme. The first applied voltage V1_1 may be referred to as a start bias voltage and the first applied voltage V1_4 may be referred to as an end bias voltage. At the application of the end bias voltage, the ISSP scheme of the program operation may be completed. For a retry read operation, the first applied voltages V1_1 through V1_4 may be sequentially applied from the first applied voltage V1_1 to the first applied voltage V1_4. The first applied voltage V1_1 may be referred to as a start read retry voltage and the first applied voltage V1_4 may be referred to as an end read retry voltage. The end read retry voltage may be a new read voltage for a read operation. The end bias voltage and the end read retry voltage may be also referred to as a determined voltage. The above embodiment is only an example. The first applied voltages (V1_1 through V1_4) may include more than or less than four voltages.

In addition, in FIG. 6, an example is illustrated in which the nonvolatile memory device 10 includes two memory stacks (ST1 and ST2) and each of the memory stacks (ST1 and ST2) includes four memory cells, but the embodiment is only an example. Even when the nonvolatile memory device 10 includes more than two memory stacks and each of the memory stacks ST1 and ST2 includes more than or less than four memory cells, the technical idea of the inventive concept may be applicable.

FIG. 7 is a table showing applied voltages for the word lines (WL1 through WL8) of the stack manager 120 according to an embodiment. Descriptions already given with reference to FIG. 6 are omitted.

Referring to FIGS. 6 and 7, the stack manager 120 may store applied voltages in an applied voltage table AVT as illustrated in FIG. 7 and may apply voltages to the word lines (WL1 through WL8) based on the applied voltage table AVT.

The stack manager 120 may apply a plurality of first applied voltages (V1_1 through V1_4) to the first word line WL1 and determine any one applied voltage (for example, V1_4) of the first applied voltages (V1_1 through V1_4) for an operation such as a programming operation and a read retry operation. The stack manager 120 may update the determined applied voltage (for example, V1_4) in the applied voltage table AVT. Next, the stack manager 120 may perform a program operation or a read operation on the second memory cell MC2_1 connected to the fifth word line WL5 by applying the determined voltage (for example, V1_4) to the fifth word line WL5 at the same level as the first word line WL1. For example, for a program operation, the determined voltage (V1_4) for the first memory stack ST1 may serve as a start bias voltage for the ISPP scheme performed on the fifth word line WL5 of the second stack ST2. For a read operation, the determined voltage (V1_4) for the first memory stack ST1 may serve as a read voltage applied to the fifth word line WL5 of the second memory stack ST2.

The stack manager 120 may apply a plurality of second applied voltages (V2_1 through V2_4) to the second word line WL2 and determine any one voltage (for example, V2_4) of the second applied voltages (V2_1 through V2_4). The stack manager 120 may update the determined voltage (for example, V2_4) in the applied voltage table AVT. Next, the stack manager 120 may perform a program operation or a read operation on the second memory cell MC2_2 connected to the sixth word line WL6 by applying the determined voltage (for example, V2_4) to the sixth word line WL6 at the same level as the second word line WL2.

The stack manager 120 may apply a plurality of third applied voltages (V3_1 through V3_4) to the third word line WL3 and determine any one voltage (for example, V3_4) of the third applied voltages (V3_1 through V3_4). The stack manager 120 may update the determined voltage (for example, V3_4) in the applied voltage table AVT. Next, the stack manager 120 may perform a program operation or a read operation on the second memory cell MC2_3 connected to the seventh word line WL7 by applying the determined voltage (for example, V3_4) to the seventh word line WL7 at the same level as the third word line WL3.

The stack manager 120 may apply a plurality of applied voltages (V4_1 through V4_4) to the fourth word line WL4 and determine any one voltage (for example, V4_4) of the fourth applied voltages (V4_1 through V4_4). The stack manager 120 may update the determined voltage (for example, V4_4) in the applied voltage table AVT. Next, the stack manager 120 may perform the program operation or the read operation on the second memory cell MC2_4 connected to the eighth word line WL8 by applying the determined voltage (V4_4) to the eighth word line WL8 at the same level as the fourth word line WL4.

Figure 8:
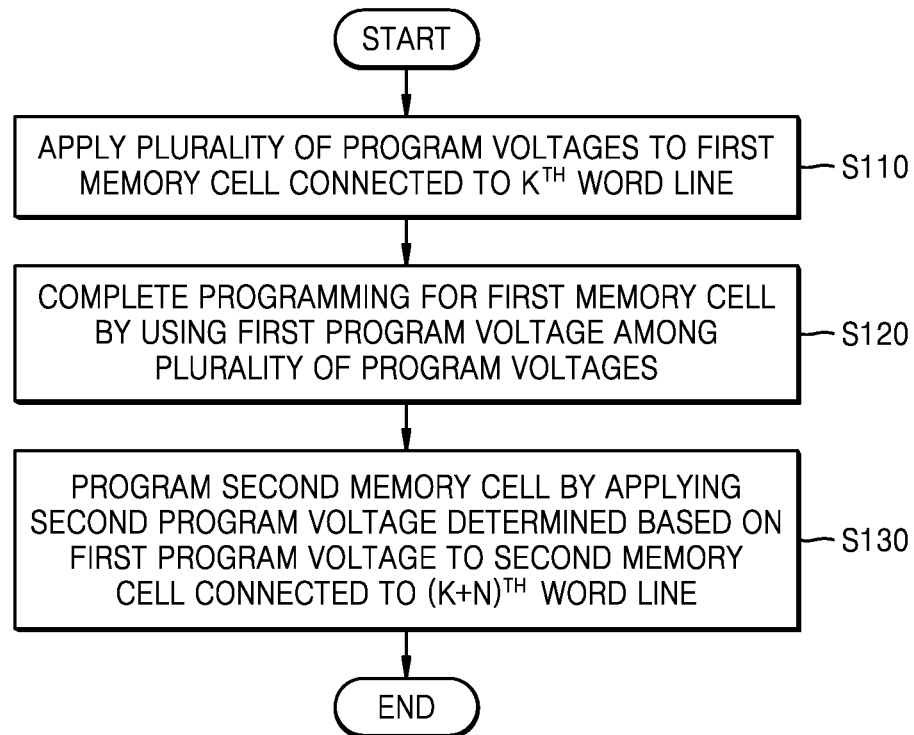
FIG. 8 is a flowchart illustrating an operation of a nonvolatile memory device, according to an embodiment.

FIG. 8 is a flowchart illustrating an operation of the nonvolatile memory device 10 according to an embodiment. FIG. 8 describes a programming method of the nonvolatile memory device 10.

Referring to FIGS. 2 and 8, the first memory stack ST1 may be sequentially connected to the first through $N^{th}$ word lines (e.g., N is an integer of 1 or greater), and the second memory stack ST2 may be sequentially connected to the $(N+1)^{th}$ through the $M^{th}$ word lines (e.g., M is an integer greater than N).

The stack manager 120 may apply the plurality of program voltages to the first memory cell connected to a $k^{th}$ word line (S110). For example, k is an integer between 1 and N inclusive. The stack manager 120 may complete a program operation performed on the first memory cell of the first memory stack ST1 by using a first program voltage among the plurality of program voltages (S120). For example, the first program voltage may correspond to the end bias voltage or the determined voltage of the ISPP scheme for the program operation. The stack manager 120 may program the second memory cell MC2 of the second memory stack ST2 by applying the first program voltage to the second memory cell connected to a $(k+N)^{th}$ word line at the same level as the $k^{th}$ word line (S130). For example, the first program voltage may serve as a start bias voltage of an ISPP scheme of a program operation performed on the second memory cell MC2 of the second memory stack ST2.

Figure 9:
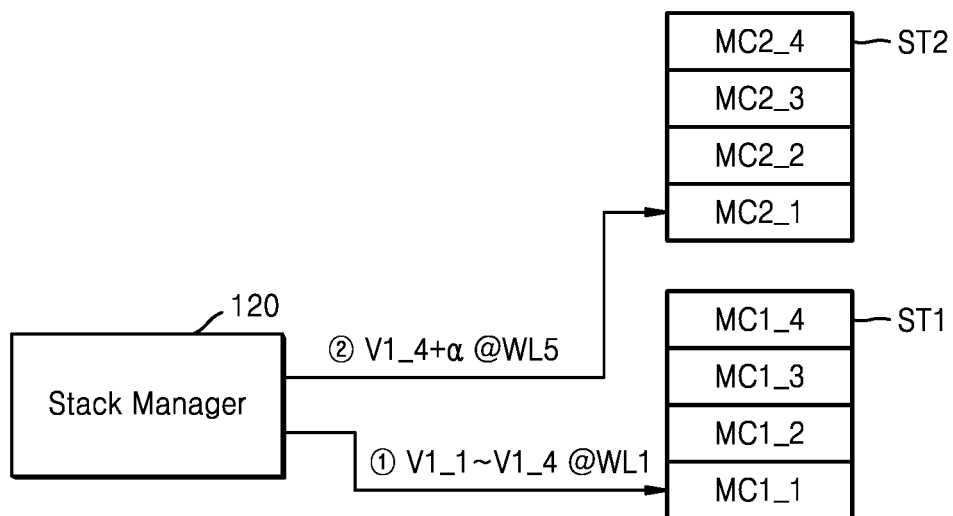
FIG. 9 is a diagram illustrating an operation of a nonvolatile memory device, according to an embodiment.

FIG. 9 is a diagram illustrating an operation of the nonvolatile memory device 10 according to an embodiment. Descriptions already given with reference to FIG. 6 are omitted.

Referring to FIG. 9, the nonvolatile memory device 10 may include the stack manager 120, the first memory stack ST1, and the second memory stack ST2. The stack manager 120 may apply the plurality of first applied voltages (V1_1 through V1_4) to the first word line WL1. The stack manager 120 may apply to the fifth word line WL5 a second applied voltage that is a sum of an offset α and any one voltage (for example, V1_4) among the plurality of first applied voltages (V1_through V1_4) applied to the first word line WL1.

In an embodiment, the stack manager 120 may determine the offset α by applying a plurality of voltages to each of the first memory stack ST1 and the second memory stack ST2. This is described later with reference to FIG. 11. For example, when the memory cells of the second memory stack ST2 have cell characteristics such as a threshold voltage distribution that is shifted by the offset α from cell characteristics of the memory cells of the first memory stack ST1, the offset α may be added to the determined voltage (e.g., V1_4) of an operation performed on the first memory stack ST1. The sum of the offset α and the determined voltage may be applied to the second memory stack ST2.

In an embodiment, the stack manager 120 may determine any one voltage (for example, V1_4) among the plurality of first applied voltages (V1_1 through V1_4) applied to the first word line WL1 and update a second applied voltage, which is a sum of the determined voltage (for example, V1_4) and the offset α, in an applied voltage table (for example, the AVT in FIG. 7).

In FIG. 9, an example is illustrated in which a voltage applied to the second memory cell MC2_1 connected to the fifth word line WL5 by using applied voltage information for the first memory cell MC1_1 connected to the first word line WL1 is described. However, the method of controlling the applied voltage of the second memory cell MC2_1 connected to the fifth word line WL5 may be applicable to the remaining second memory cells (MC2_2 through MC2_4).

Figure 10:
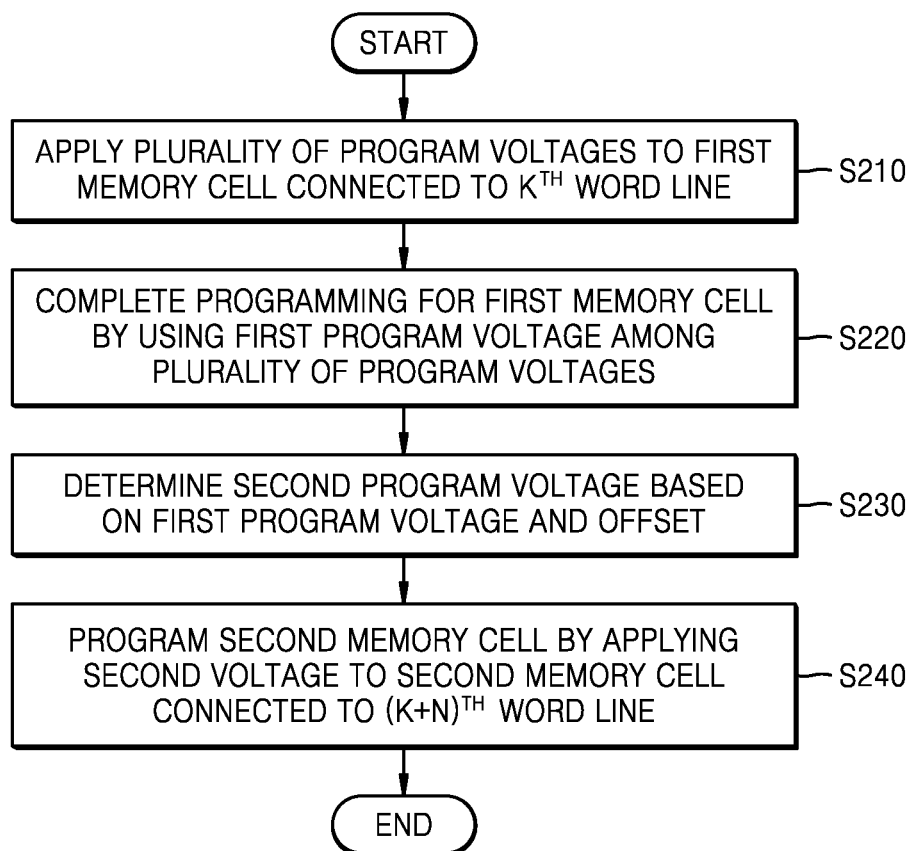
FIG. 10 is a flowchart illustrating an operation of a nonvolatile memory device, according to an embodiment.

FIG. 10 is a flowchart illustrating an operation of the nonvolatile memory device 10 according to an embodiment. FIG. 10 shows a programming method of the nonvolatile memory device 10.

Referring to FIGS. 2 and 10, the first memory stack ST1 may be sequentially connected to the first through $N^{th}$ word lines, and the second memory stack ST2 may be sequentially connected to the $(N+1)^{th}$ through $M^{th}$ word lines. N is an integer of one or greater, and M is an integer greater than N.

The stack manager 120 may apply the plurality of program voltages to the first memory cell connected to the $k^{th}$ word line (S210). k is an integer between 1 and N inclusive. The stack manager 120 may complete the program for the first memory cell by using the first program voltage among the plurality of program voltages (S220). The stack manager 120 may determine the second program voltage based on the first program voltage and the offset (S230). The stack manager 120 may program the second memory cell by applying the second program voltage to the second memory cell connected to the $(k+N)^{th}$ word line at the same level as the $k^{th}$ word line (S240).

Figure 11:
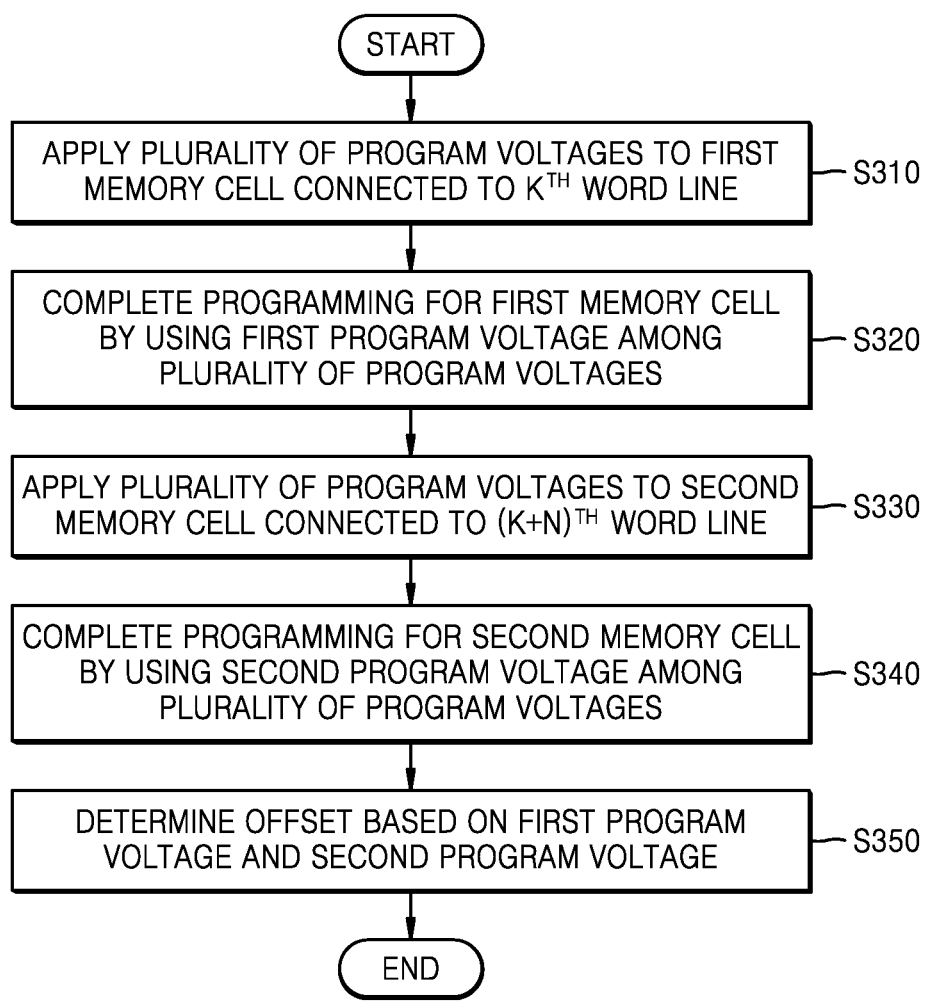
FIG. 11 is a flowchart illustrating an operation of a nonvolatile memory device, according to an embodiment.

FIG. 11 is a flowchart illustrating an operation of the nonvolatile memory device 10 according to an embodiment. FIG. 11 shows a method of determining the offset of the nonvolatile memory device 10.

Referring to FIGS. 2 and 11, the first memory stack ST1 may be sequentially connected to the first through $N^{th}$ word lines, and the second memory stack ST2 may be sequentially connected to the $(N+1)^{th}$ through the $M^{th}$ word lines. N is an integer of 1 or greater, and M is an integer greater than N.

The stack manager 120 may apply the plurality of program voltages to the first memory cell connected to the $k^{th}$ word line (S310). The stack manager 120 may complete the program for the first memory cell by using the first program voltage among the plurality of program voltages (S320).

The stack manager 120 may apply to the second memory stack ST2 the plurality of program voltages to the second memory cell connected to the $(K+N)^{th}$ word line at the same level as the $k^{th}$ word line (S330). The stack manager 120 may complete the program for the second memory cell by using the second program voltage among the plurality of program voltages (S340).

The stack manager 120 may determine the offset based on the first program voltage and the second program voltage. In an embodiment, the stack manager 120 may determine a difference between the first program voltage and the second program voltage as the offset (S350). The first program voltage and the second program voltage may be referred to as a first test program voltage and a second test program voltage respectively.

FIG. 11 illustrates a method of determining the offset used in the program operation. However, similar to the above-described method, the stack manager 120 may determine the offset used in the read operation by applying a plurality of read voltages to a word line at the same level in the plurality of memory stacks.

Figure 12:
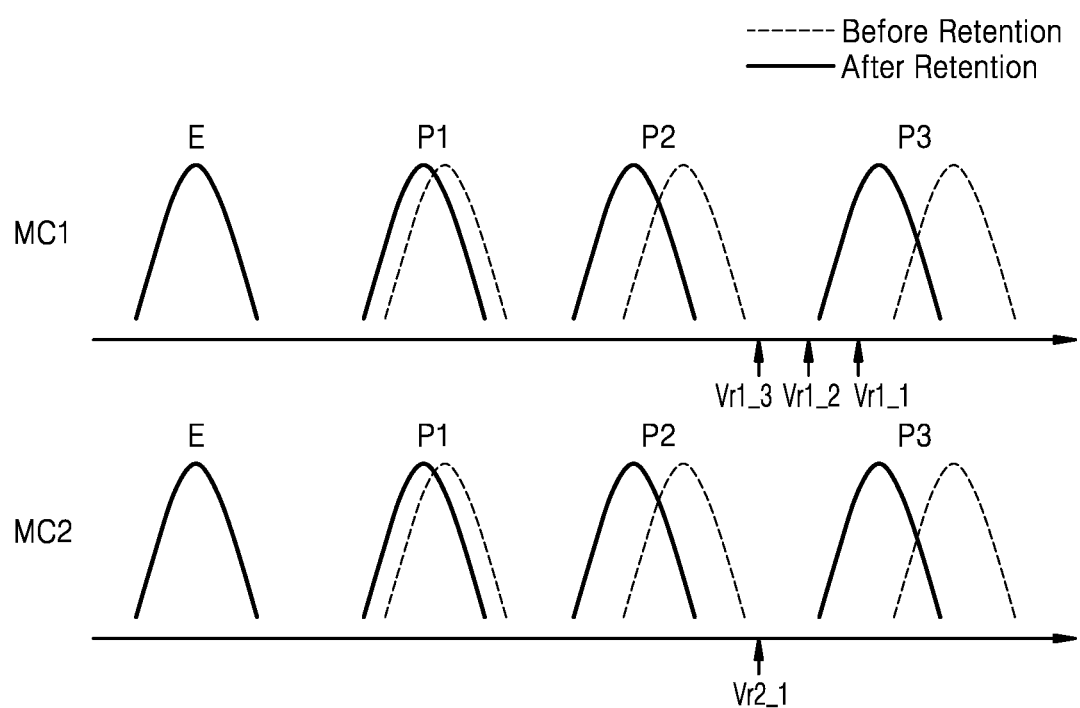
FIG. 12 is a graph illustrating a cell distribution of a memory cell according to an embodiment.

FIG. 12 is a graph illustrating a cell threshold voltage distribution of a memory cell according to an embodiment. FIG. 12 illustrates the read operation of the nonvolatile memory device 10.

Referring to FIGS. 2 and 12, the nonvolatile memory device 10 may program the first memory cell MC1 included in the first memory stack ST1 and the second memory cell MC2 included in the second memory stack ST2 to one of an erase state E and three programmed states P1 to P3. A retention phenomenon may occur in the first memory cell MC1 and the second memory cell MC2 over time, and the cell distribution may be changed from dashed lines to solid lines. Accordingly, the nonvolatile memory device 10 may fail in the error correction in the read process for the first memory cell MC1 and the second memory cell MC2, and then, after a level of the read voltage is changed, may perform the read retry operation in which the read operation is performed again.

For the read retry operation, the stack manager 120 may apply a plurality of first read retry voltages (Vr1_1 through Vr1_3) to the first memory cell MC1 and may succeed in the read operation by using the first read retry voltage (for example, Vr1_3) among the plurality of first read retry voltages (Vr1_1 through Vr1_3). For example, the first read retry voltage (for example, Vr1_3) may be referred to as the end read retry voltage or the determined voltage of the read retry operation. In the present specification, an operation in which the plurality of first read retry voltages (Vr1_1 through Vr1_3) are applied for the read retry operation and the read operation is performed by using the first read retry voltage (for example, Vr1_3) may be referred to as a valley searching algorithm.

The stack manager 120 may determine the second read voltage Vr2_1 based on the first read retry voltage Vr1_3 determined for the second memory cell MC2 of the second memory stack ST2 at the same level as the first memory cell MC1 and may read the second memory cell MC2 by using the determined second read voltage Vr2_1. For example, the first read retry voltage Vr1_3 may serve as a read voltage for a read operation performed on the second memory cell MC2.

According to an embodiment, by performing the read operation on the second memory cell MC2 included in the second memory stack ST2 based on the first read voltage (for example, Vr1_3) that is determined as a result of the read retry operation for the first memory cell MC1 included in the first memory stack ST1, the number of applied voltages may be reduced, and a read performance may be improved.

Figure 13:
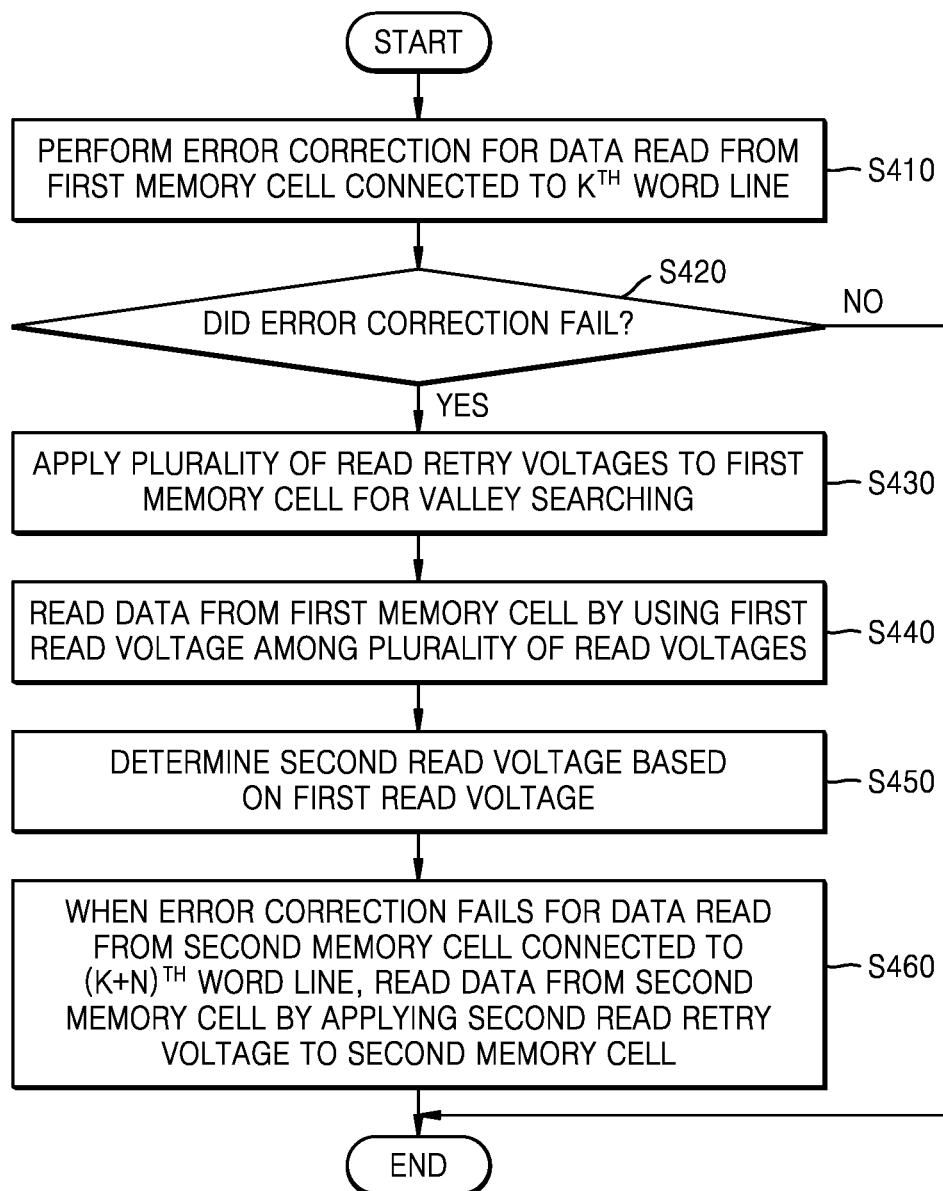
FIG. 13 is a flowchart illustrating an operation of a nonvolatile memory device, according to an embodiment.

FIG. 13 is a flowchart illustrating an operation of the nonvolatile memory device 10, according to an embodiment. FIG. 13 illustrates the read method of the nonvolatile memory device 10.

Referring to FIGS. 2 and 13, the first memory stack ST1 may be sequentially connected to the first through $N^{th}$ word lines, and the second memory stack ST2 may be sequentially connected to the $(N+1)^{th}$ through the $M^{th}$ word lines. N is an integer of 1 or greater, and M is greater than N.

The stack manager 120 may perform an error correction operation on data read from the first memory cell connected to the $k^{th}$ word line (S410 and S420). "k" is an integer between 1 and N inclusive. When the error correction operation is successful, data related with the succeeded error correction may be output. When the error correction operation fails, for the valley searching, the stack manager 120 may apply the plurality of read retry voltages to the first memory cell (S430). The stack manager 120 may succeed in reading data from the first memory cell by using a first read voltage among the plurality of read retry voltages (S440).

The stack manager 120 may determine a second read voltage based on the first read voltage (S450). In an embodiment, the stack manager 120 may determine the voltage level of the second read voltage to be identical to the voltage level of the first read voltage. In an embodiment, the stack manager 120 may determine the voltage level of the second read voltage based on the first read voltage and the offset determined through the method described with reference to FIG. 11.

When the error correction for data read from the second memory cell connected to the $(k+N)^{th}$ word line at the same level as the $k^{th}$ word line fails, the stack manager 120 may read data from the memory cell by applying the second read voltage to the second memory cell (S460).

Figure 14:
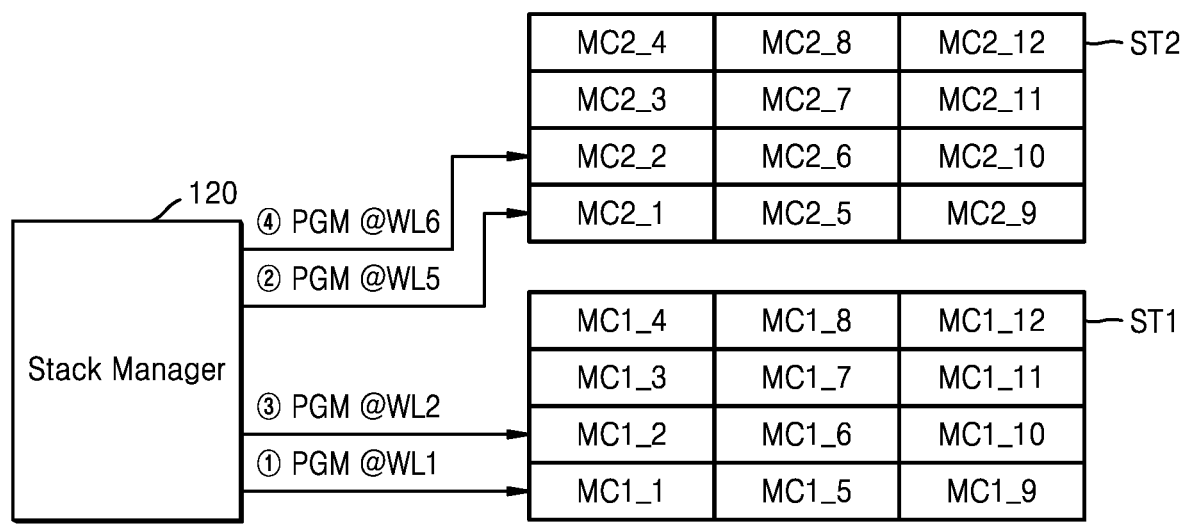
FIG. 14 is a diagram illustrating an operation of a nonvolatile memory device, according to an embodiment.

FIG. 14 is a diagram illustrating an operation of the nonvolatile memory device 10 according to an embodiment.

Referring to FIG. 14, the nonvolatile memory device 10 may include the stack manager 120, the first memory stack ST1, and the second memory stack ST2. The first memory stack ST1 may include a plurality of first memory cells (MC1_1 through MC1_12), and the second memory stack ST2 may include a plurality of second memory cells (MC2_1 through MC2_12).

The stack manager 120 may sequentially program the first memory cells (MC1_1, MC1_5, and MC1_9) connected to the first word line WL1. After the program for the first memory cells (MC1_1, MC1_5, and MC1_9) connected to the first word line WL1 is completed, the stack manager 120 may sequentially program the second memory cells (MC2_1, MC2_5, and MC2_9) connected to the fifth word line WL5.

The stack manager 120 may sequentially program the first memory cells (MC1_2, MC1_6, and MC1_10) connected to the second word line WL2. After the program for the second memory cells (MC1_2, MC1_6, and MC1_10) connected to the second word line WL2 is completed, the stack manager 120 may sequentially program the second memory cells (MC2_2, MC2_6, and MC2_10) connected to the sixth word line WL6.

As described above, since channel hole profiles for the first and second memory stacks ST1 and ST2 are substantially the same, the memory cells (for example, MC1_1, MC1_5, MC1_9, MC2_1, MC2_5, and MC2_9) at the same levels within the first and second memory stacks ST1 and ST2 may have substantially the same cell characteristic such as a cell threshold voltage distribution and thus the levels of the program voltages required for the program operation may be substantially the same. For example, the memory cells MC1_1 and MC2_1 are at the same level within the first and second memory stacks ST1 and ST2, respectively, and thus the levels of the program voltages may be substantially the same. The stack manager 120 according to an embodiment may sequentially program the memory cells at the same level within the plurality of memory stacks (ST1 and ST2), and accordingly, by changing only the address, without changing the voltage level, a plurality of memory cells may be programmed.

Figure 15:
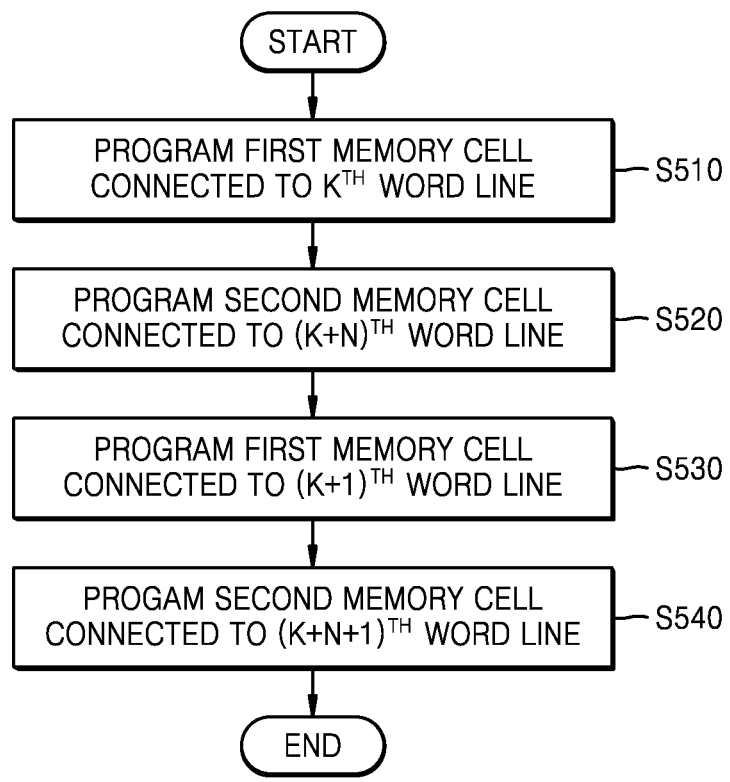
FIG. 15 is a flowchart illustrating an operation of a nonvolatile memory device, according to an embodiment.

FIG. 15 is a flowchart illustrating an operation of the nonvolatile memory device 10 according to an embodiment. FIG. 15 illustrates a program method of the nonvolatile memory device 10.

Referring to FIGS. 2 and 15, the first memory stack ST1 may be sequentially connected to the first through $N^{th}$ word lines, and the second memory stack ST2 may be sequentially connected to the $(N+1)^{th}$ through $M^{th}$ word lines. N is an integer of one or greater, and M is an integer greater than N.

The stack manager 120 may program the first memory cells connected to the $k^{th}$ word line (S510). "k" is an integer between one and N inclusive. After the program for the first memory cells connected to the $k^{th}$ word line is completed, the stack manager 120 may sequentially program the second memory cells connected to the $(k+N)^{th}$ word line (S520). The first memory cells connected to the $k^{th}$ word line and the second memory cells connected to the $(k+N)^{th}$ word line may be positioned at the same level within the first and second memory stacks ST1 and ST2, respectively.

When the program for the second memory cells connected to the $(k+N)^{th}$ word line is completed, the stack manager 120 may sequentially program the first memory cells connected to the $(k+1)^{th}$ word line (S530). After the program for the first memory cells connected to the $(k+1)^{th}$ word line is completed, the stack manager 120 may sequentially program the second memory cells connected to the $(k+N+1)^{th}$ word line of the second memory stack ST2 at the same level as the $(k+1)^{th}$ word line (S540). The first memory cells connected to the $(k+1)^{th}$ word line and the second memory cells connected to the $(k+1+N)^{th}$ word line may be positioned at the same level within the first and second memory stacks ST1 and ST2, respectively.

Figure 16:
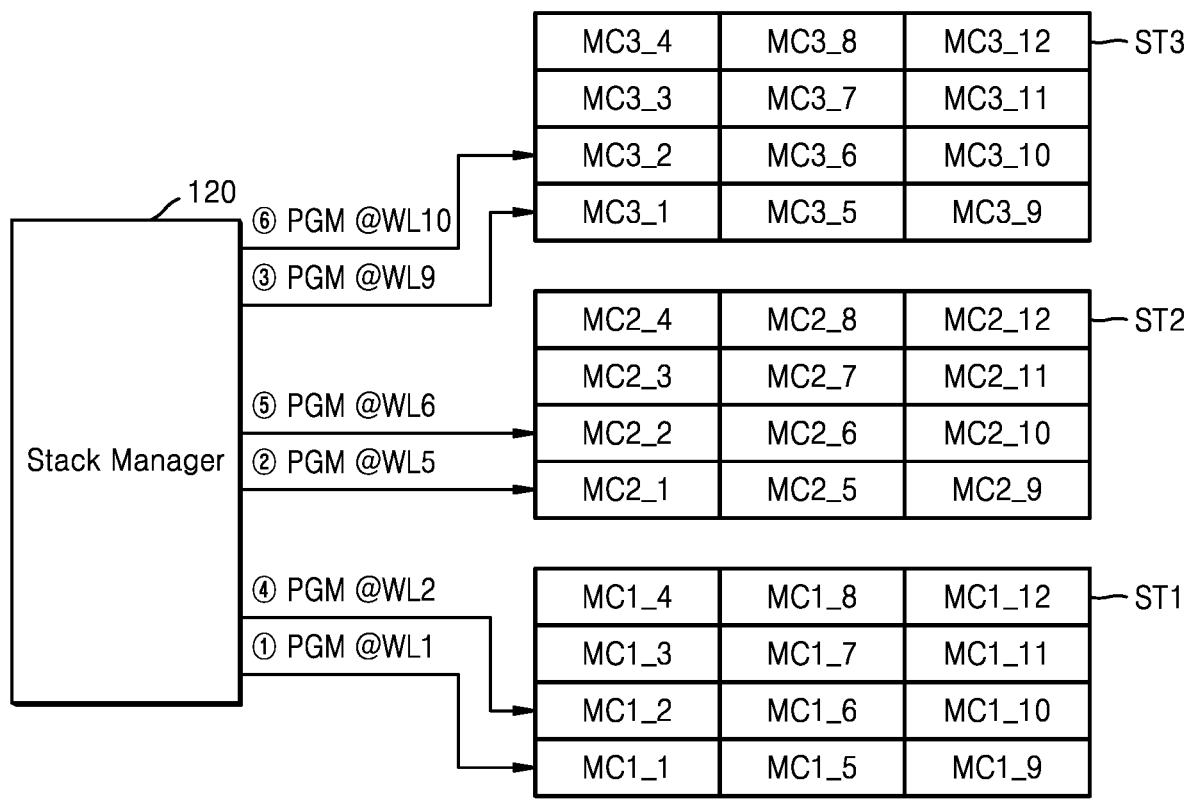
FIG. 16 is a diagram illustrating an operation of a nonvolatile memory device according to an embodiment.

FIG. 16 is a diagram illustrating an operation of the nonvolatile memory device 10, according to an embodiment. FIG. 16 illustrates program operations of the nonvolatile memory device 10 including three memory stacks (ST1 through ST3). Descriptions already given with reference to FIG. 14 are omitted.

Referring to FIG. 16, the nonvolatile memory device 10 may include the stack manager 120, the first memory stack ST1, the second memory stack ST2, and a third memory stack ST3, and the first through third memory stacks ST1 through ST3 may constitute a memory cell array (refer to 140 in FIG. 2) through being sequentially stacked on each other. The first memory stack ST1 may include the plurality of first memory cells (MC1_1 through MC1_12), the second memory stack ST2 may include the plurality of second memory cells (MC2_1 through MC2_12), and the third memory stack ST3 may include a plurality of third memory cells (MC3_1 through MC3_12).

The stack manager 120 may sequentially program the first memory cells (MC1_1, MC1_5, and MC1_9) connected to the first word line WL1 and the second memory cells (MC2_1, MC2_5, and MC2_9) connected to the fifth word line WL5. Next, the stack manager 120 may sequentially program the third memory cells (MC3_1, MC3_5, and MC3_9) connected to the ninth word line WL9. The first memory cells (MC1_1, MC1_5 and MC1_9), the second memory cells (MC2_1, MC2_5 and MC2_9) and the third memory cells (MC3_1, MC3_5 and MC3_9) may be positioned at the same level within the first, second and third memory stacks ST1, ST2 and ST3, respectively.

The stack manager 120 may sequentially program the first memory cells (MC1_2, MC1_6, and MC1_10) connected to the second word line WL2 and the second memory cells (MC2_2, MC2_6, and MC2_10) connected to the sixth word line WL6. Next, the stack manager 120 may sequentially program the third memory cells (MC3_2, MC3_6, and MC3_10) connected to the tenth word line WL10. The first memory cells (MC1_2, MC1_6 and MC1_10), the second memory cells (MC2_2, MC2_6 and MC2_10) and the third memory cells (MC3_2, MC3_6 and MC3_10) may be positioned at the same level within the first, second and third memory stacks ST1, ST2 and ST3, respectively.

Even though FIG. 16 illustrates an embodiment in which the nonvolatile memory device 10 includes three memory stacks (ST1, ST2, and ST3), the technical idea of the inventive concept is applicable to embodiments in which the nonvolatile memory device 10 includes more than three memory stacks.

Figure 17:
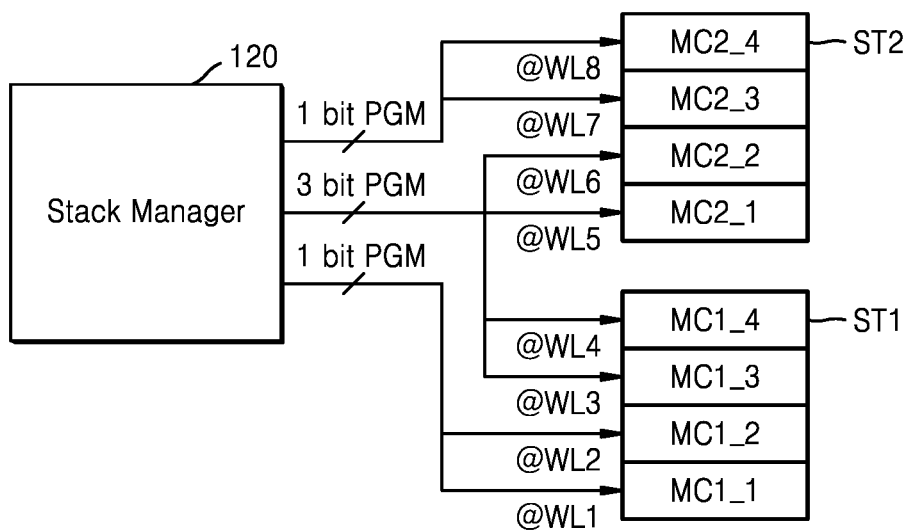
FIG. 17 is a diagram illustrating an operation of a nonvolatile memory device according to an embodiment.

FIG. 17 is a diagram illustrating an operation of the nonvolatile memory device 10, according to an embodiment. FIG. 17 is a diagram illustrating a program method of the nonvolatile memory device 10.

Referring to FIG. 17, the nonvolatile memory device 10 may include the stack manager 120, the first memory stack ST1, and the second memory stack ST2. The first memory stack ST1 may include the plurality of first memory cells (MC1_1 through MC1_4), and the second memory stack ST2 may include the plurality of second memory cells (MC2_1 through MC2_4).

The stack manager 120 may program the first memory cells (MC1_1 and MC1_2) connected to the first word line WL1 and the second word line WL2 in a first bit program mode. In an example in which the first bit program mode programs 1 bit per a memory cell, the stack manager 120 may program the first memory cells (MC1_1 and MC1_2) connected to the first word line WL1 and the second word line WL2 as single level cells (SLCs).

The stack manager 120 may program the first memory cells (MC1_3 and MC1_4) connected to the third word line WL3 and the fourth word line WL4, and the second memory cells (MC2_1 and MC2_2) connected to the fifth word line WL5 and the sixth word line WL6 in a second bit program mode. In an example in which the second bit program mode programs 3 bits per a memory cell, the stack manager 120 may program first memory cells (MC1_3 and MC1_4) connected to the third word line WL3 and the fourth word line WL4, and the second memory cells (MC2_1 and MC2_2) connected to the fifth word line WL5 and the sixth word line WL6 as triple level cells (TLCs).

The stack manager 120 may program the second memory cells (MC2_3 and MC2_4) connected to the seventh word line WL7 and the eighth word line WL8 in a third bit program mode. In an example in which the third bit program mode performs 1 bit per a memory cell, the stack manager 120 may program the second memory cells (MC2_3 and MC2_4) connected to the seventh word line WL7 and the eighth word line WL8 as SLCs.

According to an embodiment, the second bit program mode may program more bits per a memory cell than the first bit and the third bit. The stack manager 120 may program memory cells (for example, MC1_3, MC1_4, MC2_1, and MC2_2) in the middle portion of the plurality of memory stacks (ST1 and ST2) with more bits per a memory cell than other memory cells (for example, MC1_1, MC1_2, MC2_3, and MC2_4). The memory cells in the middle portion of the plurality of memory stacks (ST1 and ST2) may be more stable than other memory cells, and by storing more bits per a memory cell in the memory cells of the middle portion, performance of the nonvolatile memory device 10 may be improved.

In FIG. 17, an example is illustrated in which the first bit and the third bit program modes respectively include a program mode in which 1 bit per a memory cell is programmed and the second bit program mode includes a program mode in which 3 bits per a memory cell are programmed. The first bit and the third bit program modes may also be referred to as a SLC program mode, and the second bit program mode may also be referred to as a TLC program mode. However, this is only an exemplary embodiment, and the first through third bits may be variously determined.

Figure 18:
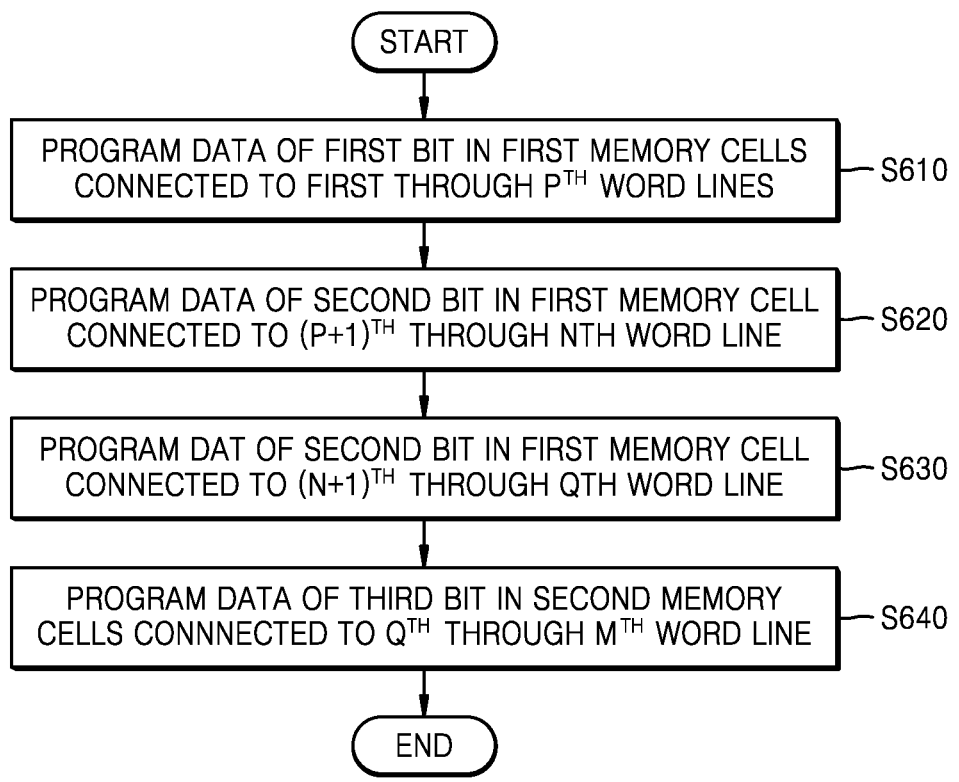
FIG. 18 is a flowchart illustrating an operation of a nonvolatile memory device according to an embodiment.

FIG. 18 is a flowchart illustrating an operation of the nonvolatile memory device 10 according to an embodiment. FIG. 18 illustrates a program method of the nonvolatile memory device 10.

Referring to FIGS. 2 and 18, the first memory stack ST1 may be sequentially connected to the first through $N^{th}$ word lines, and the second memory stack ST2 may be sequentially connected to the $(N+1)^{th}$ through $M^{th}$ word lines. N is an integer of one or greater, and M is an integer greater than N.

The stack manager 120 may program data using the first bit program mode in the first memory cells connected to the first through $p^{th}$ word lines (S610). "p" is equal to or smaller than N. The stack manager 120 may program data using the second bit program mode in the first memory cells connected to the $(p+1)^{th}$ through $N^{th}$ word lines (S620). The stack manager 120 may program data using the second bit program mode in the second memory cells connected to the $(N+1)^{th}$ through $q^{th}$ word lines (S630). "q" is an integer between (N+2) and (M−2) inclusive. The stack manager 120 may program data using the third bit program mode in the second memory cells connected to the $(q+1)^{th}$ through $M^{th}$ word lines (S640). In an embodiment, the second bit program mode may program more bits per a memory cell than the first bit program mode and the second bit program mode. For example, when the second bit program mode is an TLC program mode, each of the first bit program mode and the second bit program mode may include an SLC program mode or an MLC program mode.

Figure 19:
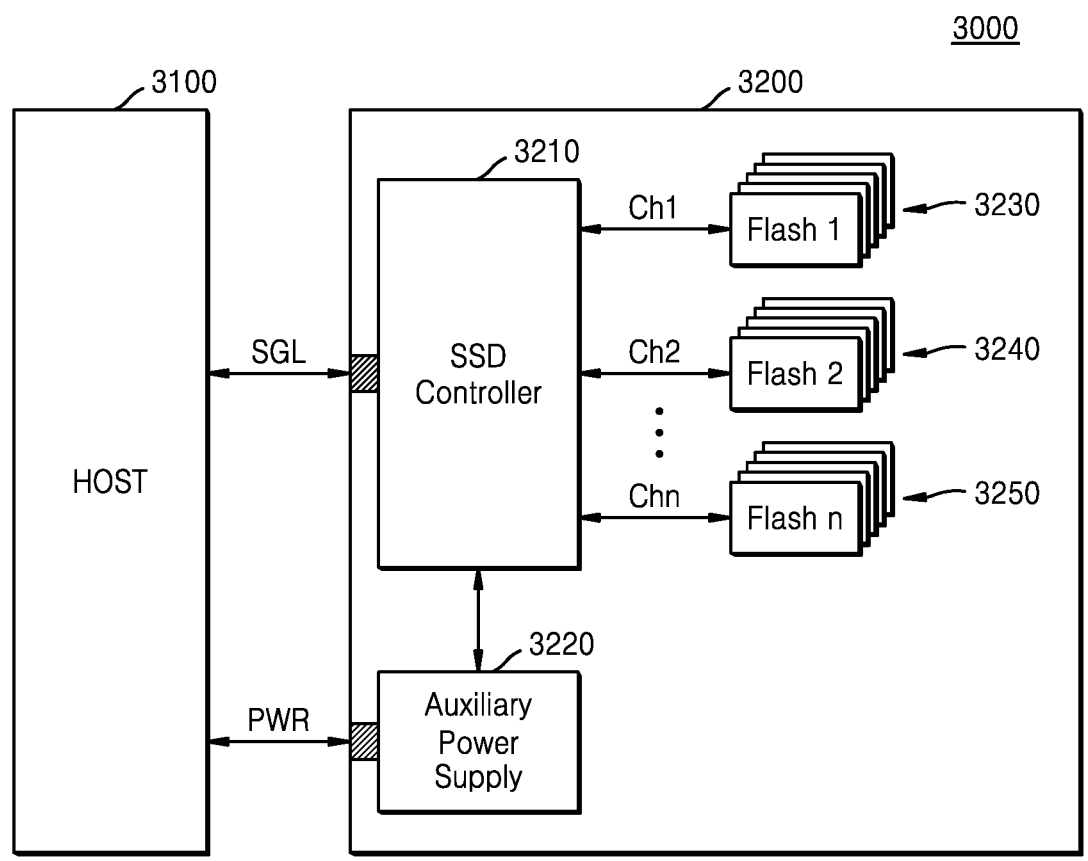
FIG. 19 is a block diagram of an example in which a nonvolatile memory device is applied to a solid state drive (SSD) system, according to an embodiment.

FIG. 19 is a block diagram of an example in which a nonvolatile memory device is applied to a solid state drive (SSD) system 3000, according to an embodiment.

Referring to FIG. 19, the SSD system 3000 may include a host 3100 and an SSD 3200. The SSD 3200 may exchange signals with the host 3100 via a signal connector and receive a power via a power connector. The SSD 3200 may include an SSD controller 3210 and a plurality of flash memory devices (3230, 3240, and 3250). Here, the SSD 3200 may be implemented by using embodiments illustrated in FIGS. 1 through 18.

The nonvolatile memory device 10 of FIG. 2 may be applied to at least one of the flash memory devices (3230, 3240, and 3250). Accordingly, at least one of the flash memory devices (3230, 3240, and 3250) may determine applied voltages for other stacks by using the applied voltage for any one of the plurality of memory stacks. In addition, at least one of the flash memory devices (3230, 3240, 3250) may, in the program operation, perform a program for a memory cell included in a plurality of memory stacks alternately between the plurality of memory stacks, or may program the memory cells on the lower portion of the plurality of memory stacks using an SLC program, for example, the memory cells on the middle portion of the plurality of memory stacks using a TLC program, for example, and the memory cells on the upper portion of the plurality of memory stacks using an SLC program or an MLC program, for example.

A nonvolatile memory device according to embodiments of the inventive concept may be mounted on or applied to not only the SSD 3200 but also a memory card system, a computing system, a universal flash storage (UFS), etc. In addition, an operation method of a nonvolatile memory device according to embodiments of the inventive concept may be applied to various kinds of electronic systems on which the nonvolatile memory device is mounted.

As described above, embodiments have been disclosed in the drawings and the specification. While the embodiments have been described herein with reference to specific terms, it should be understood that they have been used only for the purpose of describing the technical idea of the inventive concept and not for limiting the scope of the inventive concept as defined in the claims. Thus, those with ordinary skill in the art will appreciate that various modifications and equivalent embodiments are possible without departing from the scope of the inventive concept. Therefore, the true scope of protection of the inventive concept should be determined by the technical idea of the appended claims.

What is claimed is:

1. A Solid State Drive (SSD) storage device comprising:
a nonvolatile memory device; and
a memory controller configured to provide a command, an address, and data to the nonvolatile memory device, the nonvolatile memory device comprising:
a first memory stack comprising a plurality of first memory cells vertically stacked on each other;
a second memory stack comprising a plurality of second memory cells vertically stacked on each other, wherein the second memory stack is vertically stacked on the first memory stack; and
a control logic configured to receive the command and set a voltage level of a second voltage applied for a second memory operation to a second memory cell of the plurality of second memory cells in the second memory stack based on a first voltage applied to a first memory cell of the plurality of first memory cells in the first memory stack in a first memory operation.

2. The SSD storage device of claim 1,
wherein the first memory stack and the second memory stack are separately formed through an independent channel hole forming process.

3. The SSD storage device of claim 1,
wherein control logic is configured to:
perform the first memory operation on the first memory cell using a plurality of voltages;
complete the first memory operation using the first voltage among the plurality of voltages wherein cell characteristics of the first memory cell are determined using the first voltage; and
perform the second memory operation on the second memory cell using the second voltage.

4. The SSD storage device of claim 1, wherein:
the first memory stack has a first channel hole and the second memory stack has a second channel hole connected to the first channel hole;
an etch profile of the first channel hole including a first channel hole width pattern is substantially the same as the second channel hole including a second hole width pattern; and
a bottom of the second channel hole has a width smaller than a width of a top of the first channel hole.

5. The SSD storage device of claim 1, wherein:
each of the plurality of first memory cells is connected to a corresponding word line of first through Nth word lines according to a stacked order of each of the plurality of the first through Nth word lines in the first memory stack;
each of the plurality of second memory cells is connected to a corresponding word line of (N+1)th through Mth word lines according to a stacked order of each of the plurality of (N+1)th through Mth in the second memory stack;
the first voltage is a voltage applied to the first memory cell connected to a kth word line;
the second voltage is a voltage applied to the second memory cell connected to a (k+N)th word line;
the kth word line and the (k+N)th word line are positioned at substantially the same level in the first memory stack and the second memory stack respectively; and
N is an integer of one or greater, M is an integer greater than N, and k is an integer between one and N inclusive.

6. The SSD storage device of claim 1,
wherein the control logic is further configured to set a voltage level of the second voltage to be the same as a voltage level of the first voltage.

7. The SSD storage device of claim 5,
wherein the control logic is further configured to set a voltage level of the second voltage to be higher or lower than a voltage level of the first voltage by an offset.

8. The SSD storage device of claim 7,
wherein the control logic is further configured to:
apply a plurality of first read voltages to perform a first read operation on the first memory cell, wherein the first read operation is completed at a first read voltage of the plurality of first read voltages;
apply a plurality of second read voltages to perform a second read operation on the second memory cell, wherein the second read operation is completed at a second read voltage of the plurality of second read voltages of the second read operation; and determine a voltage level difference between the first read voltage and the second read voltage as the offset.

9. The SSD storage device of claim 7, wherein the control logic is configured to:

apply a plurality of first program voltages to perform a first program operation on the first memory cell, wherein the first program operation is completed at a first program voltage of the plurality of first program voltages;

apply a plurality of second program voltages to perform a second program operation on the second memory cell, wherein the second program operation is completed at a second program voltage of the plurality of second program voltages; and determine a voltage level difference between the first program voltage and the second program voltage as the offset.

10. The SSD storage device of claim 5, wherein:

the first voltage is a first read voltage for determining a data state of the first memory cell;

the second voltage is a second read voltage for determining a data state of the second memory cell; and the control logic is configured to set a voltage level of the second read voltage based on a voltage level of the first read voltage.

\* \* \* \* \*